(12) United States Patent
Andrews et al.

(10) Patent No.: US 11,101,411 B2
(45) Date of Patent: Aug. 24, 2021

(54) SOLID-STATE LIGHT EMITTING DEVICES INCLUDING LIGHT EMITTING DIODES IN PACKAGE STRUCTURES

(71) Applicant: Cree, Inc., Durham, NC (US)

(72) Inventors: Peter Scott Andrews, Durham, NC (US); Colin Blakely, Raleigh, NC (US); Jesse Reiherzer, Raleigh, NC (US); Arthur F. Pun, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 16/453,447

(22) Filed: Jun. 26, 2019

(65) Prior Publication Data

US 2020/0411730 A1    Dec. 31, 2020

(51) Int. Cl.
*H01L 33/50* (2010.01)
*H01L 33/60* (2010.01)
*H01L 33/26* (2010.01)

(52) U.S. Cl.
CPC ............ *H01L 33/502* (2013.01); *H01L 33/26* (2013.01); *H01L 33/60* (2013.01)

(58) Field of Classification Search
CPC ........ H01L 33/502; H01L 33/26; H01L 33/60
USPC ..................... 257/98; 438/22, 25, 26, 27, 29
See application file for complete search history.

(56) References Cited

U.S. PATENT DOCUMENTS

| | | | |
|---|---|---|---|
| 2,857,541 A | 10/1958 | Etzel et al. | |
| 4,918,497 A | 4/1990 | Edmond | |
| 4,966,862 A | 10/1990 | Edmond | |
| 5,027,168 A | 6/1991 | Edmond | |
| 5,177,500 A | 1/1993 | Ng | |
| 5,210,051 A | 5/1993 | Carter, Jr. | |
| 5,338,944 A | 8/1994 | Edmond et al. | |
| 5,359,345 A | 10/1994 | Hunter | |
| 5,393,993 A | 2/1995 | Edmond et al. | |
| 5,416,342 A | 5/1995 | Edmond et al. | |
| 5,523,589 A | 6/1996 | Edmond et al. | |

(Continued)

FOREIGN PATENT DOCUMENTS

| | | |
|---|---|---|
| CN | 102214651 A | 10/2011 |
| CN | 103864302 A | 6/2014 |

(Continued)

OTHER PUBLICATIONS

Advisory Action for U.S. Appl. No. 16/118,747, dated Aug. 18, 2020, 3 pages.

(Continued)

*Primary Examiner* — Didarul A Mazumder
(74) *Attorney, Agent, or Firm* — Withrow & Terranova, PLLC

(57) ABSTRACT

Solid-state light emitting devices including light-emitting diodes (LEDs), and more particularly packaged LEDs are disclosed. LED packages are disclosed that include an LED chip with multiple discrete active layer portions mounted on a submount. The LED packages may further include wavelength conversion elements and light-altering materials. The multiple discrete active layer portions may be electrically connected in series, parallel, or in individually addressable arrangements. The LED chip with the multiple discrete active layer portions may provide the LED package with improved brightness, improved alignment, simplified manufacturing, and reduced costs.

19 Claims, 11 Drawing Sheets

(56) References Cited

U.S. PATENT DOCUMENTS

| | | |
|---|---|---|
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,034,422 A | 3/2000 | Horita et al. |
| 6,120,600 A | 9/2000 | Edmond et al. |
| 6,187,606 B1 | 2/2001 | Edmond et al. |
| 6,201,262 B1 | 3/2001 | Edmond et al. |
| 6,274,399 B1 | 8/2001 | Kern et al. |
| 6,600,175 B1 | 7/2003 | Baretz et al. |
| 6,646,330 B2 | 11/2003 | Kubara et al. |
| 6,649,440 B1 | 11/2003 | Krames et al. |
| 6,791,119 B2 | 9/2004 | Slater, Jr. et al. |
| 6,853,010 B2 | 2/2005 | Slater, Jr. et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,344,902 B2 | 3/2008 | Basin et al. |
| 7,361,938 B2 | 4/2008 | Mueller et al. |
| D572,387 S | 7/2008 | Uemoto et al. |
| D573,731 S | 7/2008 | Uemoto et al. |
| 7,456,499 B2 | 11/2008 | Loh et al. |
| 7,495,387 B2 | 2/2009 | Hayashi et al. |
| 7,564,180 B2 | 7/2009 | Brandes |
| D597,502 S | 8/2009 | Ogata et al. |
| 7,655,957 B2 | 2/2010 | Loh et al. |
| D611,628 S | 3/2010 | Uemoto et al. |
| D612,958 S | 3/2010 | Uemoto et al. |
| 7,754,507 B2 | 7/2010 | Epler et al. |
| 7,791,061 B2 | 9/2010 | Edmond et al. |
| 7,802,901 B2 | 9/2010 | McMillan |
| 7,821,023 B2 | 10/2010 | Yuan et al. |
| 7,847,303 B2 | 12/2010 | Jung et al. |
| 7,928,648 B2 | 4/2011 | Jang et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van De Ven et al. |
| 8,044,418 B2 | 10/2011 | Loh et al. |
| 8,058,088 B2 | 11/2011 | Cannon et al. |
| 8,075,165 B2 | 12/2011 | Jiang et al. |
| 8,125,137 B2 | 2/2012 | Medendorp, Jr. et al. |
| 8,232,564 B2 | 7/2012 | Chakraborty |
| 8,264,138 B2 | 9/2012 | Negley et al. |
| 8,337,071 B2 | 12/2012 | Negley et al. |
| 8,362,512 B2 | 1/2013 | Hussell et al. |
| 8,384,097 B2 | 2/2013 | Yan |
| 8,390,022 B2 | 3/2013 | Hussell et al. |
| 8,410,679 B2 | 4/2013 | Ibbetson et al. |
| 8,425,271 B2 | 4/2013 | Hussell et al. |
| 8,563,339 B2 | 10/2013 | Tarsa et al. |
| 8,598,793 B2 | 12/2013 | Yan et al. |
| D703,841 S | 4/2014 | Feng et al. |
| 8,729,589 B2 | 5/2014 | Hussell et al. |
| 8,822,032 B2 | 9/2014 | Borrelli et al. |
| 8,866,410 B2 | 10/2014 | Negley et al. |
| 8,940,561 B2 | 1/2015 | Donofrio et al. |
| 8,970,131 B2 | 3/2015 | Brandes et al. |
| 8,998,444 B2 | 4/2015 | Roberts et al. |
| 9,024,340 B2 | 5/2015 | Minato et al. |
| 9,024,349 B2 | 5/2015 | Chitnis et al. |
| 9,053,958 B2 | 6/2015 | Donofrio et al. |
| 9,131,561 B2 | 9/2015 | Athalye |
| 9,159,888 B2 | 10/2015 | Chitnis et al. |
| 9,192,013 B1 | 11/2015 | van de Ven et al. |
| 9,277,605 B2 | 3/2016 | Ni |
| 9,310,026 B2 | 4/2016 | Negley |
| D756,547 S | 5/2016 | Zhang et al. |
| 9,414,454 B2 | 8/2016 | Brandes et al. |
| 9,461,222 B1 | 10/2016 | Wei |
| 9,713,211 B2 | 7/2017 | van de Ven et al. |
| D797,321 S | 9/2017 | Liu |
| 9,816,691 B2 | 11/2017 | Yan |
| 9,893,243 B2 | 2/2018 | West et al. |
| 10,057,983 B1 | 8/2018 | Etzkorn et al. |
| 10,211,187 B2 | 2/2019 | Crompvoets et al. |
| D851,790 S | 6/2019 | Reiherzer et al. |
| 10,651,353 B2 | 5/2020 | Senuki et al. |
| 2004/0048219 A1 | 3/2004 | Yun |
| 2005/0127385 A1 | 6/2005 | Reeh et al. |
| 2006/0221272 A1 | 10/2006 | Negley et al. |
| 2007/0104828 A1 | 5/2007 | Fornaguera |
| 2007/0241661 A1 | 10/2007 | Yin |
| 2008/0036940 A1 | 2/2008 | Song et al. |
| 2008/0258130 A1 | 10/2008 | Bergmann et al. |
| 2009/0001490 A1 | 1/2009 | Bogner et al. |
| 2009/0021841 A1 | 1/2009 | Negley et al. |
| 2009/0039375 A1 | 2/2009 | LoToquin et al. |
| 2009/0050908 A1 | 2/2009 | Yuan et al. |
| 2009/0051022 A1 | 2/2009 | Andoh |
| 2009/0166665 A1 | 7/2009 | Haitko |
| 2009/0261708 A1 | 10/2009 | Moseri et al. |
| 2009/0316409 A1 | 12/2009 | Kim et al. |
| 2010/0154035 A1 | 6/2010 | Damola et al. |
| 2010/0244060 A1 | 9/2010 | Lee et al. |
| 2010/0320928 A1 | 12/2010 | Kaihotsu et al. |
| 2011/0018017 A1 | 1/2011 | Bierhuizen et al. |
| 2011/0031516 A1 | 2/2011 | Basin et al. |
| 2011/0049545 A1 | 3/2011 | Basin et al. |
| 2011/0068702 A1 | 3/2011 | van de Ven et al. |
| 2011/0169033 A1 | 7/2011 | Fukunga et al. |
| 2011/0180822 A1 | 7/2011 | Ruhnau et al. |
| 2011/0254022 A1 | 10/2011 | Sasano |
| 2011/0309388 A1 | 12/2011 | Ito et al. |
| 2012/0061692 A1 | 3/2012 | Chang et al. |
| 2012/0086023 A1 | 4/2012 | Veerasamy et al. |
| 2012/0104452 A1 | 5/2012 | Miyoshi et al. |
| 2012/0107622 A1 | 5/2012 | Borrelli et al. |
| 2012/0111471 A1 | 5/2012 | Negley et al. |
| 2012/0193651 A1 | 8/2012 | Edmond et al. |
| 2012/0305949 A1 | 12/2012 | Donofrio et al. |
| 2012/0306355 A1 | 12/2012 | Seibel, II |
| 2013/0033169 A1 | 2/2013 | Ito et al. |
| 2013/0057593 A1 | 3/2013 | Morishita |
| 2013/0069781 A1 | 3/2013 | Terwilliger et al. |
| 2013/0077299 A1 | 3/2013 | Hussell et al. |
| 2013/0092960 A1 | 4/2013 | Wilcox et al. |
| 2013/0221509 A1 | 8/2013 | Oda et al. |
| 2013/0256710 A1 | 10/2013 | Andrews et al. |
| 2013/0256711 A1 | 10/2013 | Joo et al. |
| 2013/0264589 A1 | 10/2013 | Bergmann et al. |
| 2013/0271991 A1 | 10/2013 | Hussell et al. |
| 2013/0301257 A1 | 11/2013 | Britt et al. |
| 2014/0138725 A1 | 5/2014 | Oyamada |
| 2014/0217325 A1 | 8/2014 | Manabe et al. |
| 2014/0217435 A1 | 8/2014 | Bergmann et al. |
| 2014/0217436 A1 | 8/2014 | Hussell et al. |
| 2014/0217443 A1 | 8/2014 | Heikman et al. |
| 2014/0239320 A1 | 8/2014 | Miyoshi et al. |
| 2014/0367713 A1 | 12/2014 | Zhang et al. |
| 2015/0028372 A1 | 1/2015 | Nakanishi et al. |
| 2015/0062915 A1 | 3/2015 | Hussell et al. |
| 2015/0155447 A1 | 6/2015 | Beppu |
| 2015/0204525 A1 | 7/2015 | Shen et al. |
| 2015/0207045 A1 | 7/2015 | Wada et al. |
| 2015/0249196 A1* | 9/2015 | Williams .............. H01L 33/405 257/88 |
| 2015/0257211 A1 | 9/2015 | Johnson et al. |
| 2015/0262987 A1 | 9/2015 | Wada et al. |
| 2015/0263247 A1 | 9/2015 | Wada et al. |
| 2015/0349218 A1 | 12/2015 | Reiherzer et al. |
| 2015/0364660 A1 | 12/2015 | Huang et al. |
| 2016/0064623 A1 | 3/2016 | Clatterbuck |
| 2016/0074833 A1 | 3/2016 | O'Brien et al. |
| 2016/0079486 A1 | 3/2016 | Sugimoto et al. |
| 2016/0093777 A1 | 3/2016 | Sato et al. |
| 2016/0111600 A1* | 4/2016 | Chae ..................... H01L 33/38 257/99 |
| 2016/0126010 A1 | 5/2016 | Wang |
| 2016/0126434 A1 | 5/2016 | Nakabayashi |
| 2016/0161098 A1 | 6/2016 | Tudorica et al. |
| 2016/0293811 A1 | 10/2016 | Hussell et al. |
| 2016/0351846 A1 | 12/2016 | Kim et al. |
| 2017/0040183 A1 | 2/2017 | Sakai et al. |

(56) References Cited

U.S. PATENT DOCUMENTS

| | | | |
|---|---|---|---|
| 2017/0092820 A1* | 3/2017 | Kim | H01L 33/32 |
| 2017/0098746 A1 | 4/2017 | Bergmann et al. | |
| 2017/0154880 A1 | 6/2017 | Ozeki et al. | |
| 2017/0263828 A1 | 9/2017 | Mao et al. | |
| 2017/0294417 A1 | 10/2017 | Edmond et al. | |
| 2017/0299798 A1* | 10/2017 | Son | G02B 6/0055 |
| 2017/0301832 A1* | 10/2017 | Basin | H01L 33/60 |
| 2017/0358624 A1* | 12/2017 | Takeya | H01L 25/167 |
| 2017/0373225 A1 | 12/2017 | Shichijo et al. | |
| 2018/0012949 A1* | 1/2018 | Takeya | H01L 51/5203 |
| 2018/0033924 A1 | 2/2018 | Andrews et al. | |
| 2018/0043178 A1 | 2/2018 | Iguchi et al. | |
| 2018/0069164 A1 | 3/2018 | Minato et al. | |
| 2018/0076368 A1 | 3/2018 | Hussell | |
| 2018/0102348 A1 | 4/2018 | Haiberger et al. | |
| 2018/0102449 A1 | 4/2018 | Pschenitzka et al. | |
| 2018/0103513 A1 | 4/2018 | Tseng et al. | |
| 2018/0130776 A1 | 5/2018 | Oka | |
| 2018/0190880 A1 | 7/2018 | Vampola et al. | |
| 2018/0190881 A1 | 7/2018 | Lin | |
| 2018/0190885 A1 | 7/2018 | Chang et al. | |
| 2019/0122592 A1 | 4/2019 | Han et al. | |
| 2019/0148346 A1 | 5/2019 | Feichtinger et al. | |
| 2019/0165231 A1 | 5/2019 | Doan et al. | |
| 2019/0312187 A1 | 10/2019 | Harada et al. | |
| 2019/0363232 A1 | 11/2019 | Murthy et al. | |
| 2020/0075813 A1 | 3/2020 | Joo et al. | |
| 2020/0075822 A1 | 3/2020 | Suich et al. | |
| 2020/0152840 A1 | 5/2020 | Hussell | |

FOREIGN PATENT DOCUMENTS

| | | |
|---|---|---|
| CN | 204088306 U | 1/2015 |
| EP | 1710846 A1 | 10/2006 |
| EP | 2216834 A1 | 8/2010 |
| EP | 2819191 A1 | 2/2013 |
| EP | 2768037 A1 | 8/2014 |
| EP | 2804225 A1 | 11/2014 |
| EP | 2927970 A1 | 10/2015 |
| WO | 2007034367 A1 | 3/2007 |
| WO | 2011007275 A1 | 1/2011 |
| WO | 2012058040 A1 | 5/2012 |
| WO | 2013154818 A1 | 10/2013 |
| WO | 2014024108 A1 | 2/2014 |
| WO | 2014133294 A1 | 9/2014 |
| WO | 2014159894 A1 | 10/2014 |
| WO | 2015026033 A1 | 2/2015 |
| WO | 2018022456 A1 | 2/2018 |

OTHER PUBLICATIONS

Advisory Action and Applicant-Initiated Interview Summary for U.S. Appl. No. 16/118,747, dated Aug. 24, 2020, 5 pages.
Non-Final Office Action for U.S. Appl. No. 16/118,747, dated Sep. 8, 2020, 32 pages.
Non-Final Office Action for U.S. Appl. No. 16/380,400, dated Jul. 27, 2020, 12 pages.
Notice of Allowance for U.S. Appl. No. 16/797,173, dated Aug. 24, 2020, 9 pages.
International Search Report and Written Opinion for International Patent Application No. PCT/US2020/038960, dated Aug. 11, 2020, 17 pages.
Author Unknown, "Black Silicon," Wikipedia [online], <https://web.archive.org/web/20150401161824/http://en.wikipedia.org/wiki/Black_Silicon> Apr. 1, 2015, 1 page.
Final Office Action for U.S. Appl. No. 16/118,747, dated Jun. 9, 2020, 43 pages.
Final Office Action for U.S. Appl. No. 16,118,779, dated Jul. 16, 2020, 35 pages.
Non-Final Office Action for U.S. Appl. No. 161545,357, dated Jun. 24, 2020, 33 pages.
Examination Report for European Patent Application No. 17748998.6, dated Jun. 25, 2020, 7 pages.
Advisory Action, Applicant-Initiated Interview Summary, and AFCP 2.0 Decision for U.S. Appl. No. 16/118,762, dated Apr. 24, 2020, 9 pages.
Non-Final Office Action for U.S. Appl. No. 16/118,762, dated May 26, 2020, 25 pages.
Notice of Allowance for U.S. Appl. No. 29/661,900, dated Apr. 29, 2020, 6 pages.
Notice of Allowance for U.S. Appl. No. 16/797,173, dated Jun. 22, 2020, 10 pages.
International Search Report and Written Opinion for International Patent Application No. PCT/US2019/028704, dated Sep. 9, 2019, 18 pages.
Non-Final Office Action for U.S. Appl. No. 16/118,762, dated Oct. 1, 2019, 36 pages.
International Search Report and Written Opinion for International Patent Application No. PCT/US2019/028708, dated Sep. 9, 2019, 20 pages.
Dupont, "DuPont™ Ti-Pure® titanium dioxide: Titanium Dioxide for Coatings," Product Brochure H-65969-2, Jun. 2007, 28 pages.
Restriction Requirement for U.S. Appl. No. 29/661,900, dated Nov. 25, 2019, 6 pages.
Notice of Allowance for U.S. Appl. No. 16/380,400, dated Nov. 27, 2019, 8 pages.
Nichia Corporation, "NC3W321AT: Specifications for White LED," NICHIA STS-DA1-4281A <Cat.No. 160603>, [online], [retrieved on May 21, 2018] Retrieved from Nichia Corporation using Internet <URL: http://www.nichia.co.jp/en/product/led.html>, 16 pages.
Nichia Corporation, "NC2W321AT: Specifications for White LED," NICHIA STS-DA1-4323A <Cat.No. 160711>, [online], [retrieved on May 21, 2018] Retrieved from Nichia Corporation using Internet <URL: http://www.nichia.co.jp/en/product/led.html>, 16 pages.
Nichia Corporation, "NC4W321AT: Specifications for White LED," NICHIA STS-DA1-4325A <Cat.No. 160711>, [online], [retrieved on May 21, 2018] Retrieved from Nichia Corporation using Internet <URL: http://www.nichia.co.jp/en/product/led.html>, 16 pages.
International Search Report and Written Opinion for International Patent Application No. PCT/US2017/043316, dated Sep. 1, 2017, 13 pages.
Non-Final Office Action for U.S. Appl. No. 15/657,027, dated Apr. 10, 2018, 11 pages.
Final Office Action for U.S. Appl. No. 15/657,027, dated Oct. 19, 2018, 17 pages.
Notice of Allowance for U.S. Appl. No. 15/657,027, dated Dec. 28, 2018, 9 pages.
International Preliminary Report on Patentability for International Patent Application No. PCT/US2017/043316, dated Feb. 7, 2019, 9 pages.
Invitation to Pay Additional Fees and Partial International Search for International Patent Application No. PCT/US2019/028704, mailed Jul. 17, 2019, 14 pages.
Invitation to Pay Additional Fees and Partial International Search for International Patent Application No. PCT/US2019/028708, mailed Jul. 17, 2019, 17 pages.
Non-Final Office Action for U.S. Appl. No. 16/380,400, dated Sep. 9, 2019, 13 pages.
Non-Final Office Action for U.S. Appl. No. 16/118,747, dated Jan. 29, 2020, 28 pages.
Final Office Action for U.S. Appl. No. 16/118,762, dated Feb. 14, 2020, 44 pages.
Non-Final Office Action for U.S. Appl. No. 16,118,779, dated Jan. 10, 2020, 27 pages.
Examination Report for European Patent Application No. 17748998.6, dated Jan. 3, 2020, 7 pages.
Notice of Allowance for U.S. Appl. No. 16/380,400, dated Mar. 17, 2020, 8 pages.
First Office Action for Chinese Patent Application No. 2017800585182, dated Jan. 27, 2021, 15 pages.
Advisory Action and Applicant-Initiated Interview Summary for U.S. Appl. No. 16/118,779, dated Nov. 20, 2020, 5 pages.
Final Office Action for U.S. Appl. No. 16/545,357, dated Dec. 7, 2020, 41 pages.
Notice of Allowance for U.S. Appl. No. 16/380,400, dated Oct. 28, 2020, 9 pages.

(56) References Cited

OTHER PUBLICATIONS

Notice of Allowance for U.S. Appl. No. 16/118,747, dated Jan. 6, 2021, 8 pages.
Final Office Action for U.S. Appl. No. 16/118,762, dated Jan. 4, 2021, 20 pages.
Non-Final Office Action for U.S. Appl. No. 16/118,779, dated Jan. 22, 2021, 27 pages.
Advisory Action and Applicant-Initiated Interview Summary for U.S. Appl. No. 16/545,357, dated Mar. 3, 2021, 4 pages.
Examination Report for European Patent Application No. 17748998.6, dated Feb. 4, 2021, 6 pages.
Advisory Action and Applicant-Initiated Interview Summary for U.S. Appl. No. 16/118,762, dated Mar. 22, 2021, 5 pages.
Notice of Allowance for U.S. Appl. No. 16/118,762, dated Apr. 16, 2021, 8 pages.
Non-Final Office Action for U.S. Appl. No. 16/545,357, dated Mar. 15, 2021, 28 pages.
International Preliminary Report on Patentability for International Patent Application No. PCT/US2019/028704, dated Dec. 10, 2020, 11 pages.
International Preliminary Report on Patentability for International Patent Application No. PCT/US2019/028708, dated Dec. 10, 2020, 12 pages.
Final Office Action for U.S. Appl. No. 16/118,779, dated Jul. 15, 2021, 25 pages.

\* cited by examiner

SOLID-STATE LIGHT EMITTING DEVICES INCLUDING LIGHT EMITTING DIODES IN PACKAGE STRUCTURES

FIELD OF THE DISCLOSURE

The present disclosure relates to solid-state lighting devices including light-emitting diodes, and more particularly to packaged light-emitting diodes.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

The art continues to seek improved light-emitting diodes and solid-state lighting devices having reduced optical losses and providing desirable illumination characteristics capable of overcoming challenges associated with conventional lighting devices.

SUMMARY

The present disclosure relates in various aspects to solid-state light emitting devices including light-emitting diodes (LEDs), and more particularly to packaged LEDs. LED packages are disclosed that include an LED chip that includes multiple discrete active layer portions mounted on a submount. The LED packages may further include wavelength conversion elements and light-altering materials. The multiple discrete active layer portions may be electrically connected in series, parallel, or in individually addressable arrangements. The LED chip with the multiple discrete active layer portions may provide the LED package with improved brightness, improved alignment, simplified manufacturing, and reduced costs compared with conventional LED packages that include multiple discrete LED chips.

In one aspect, an LED package comprises: a submount; an LED chip on the submount, the LED chip comprising an active layer on a monolithic substrate, the active layer forming a plurality of discrete active layer portions that are arranged between the submount and the monolithic substrate; a wavelength conversion element on the monolithic substrate; and a light-altering material on the submount, the light-altering material arranged around a perimeter of the LED chip and around a perimeter of the wavelength conversion element. In certain embodiments, the monolithic substrate is a light transmissive substrate. The LED chip may form a plurality of recesses that extend through an entire thickness of the active layer to define the plurality of discrete active layer portions. In certain embodiments, the LED chip comprises a plurality of epitaxial layers on the monolithic substrate and the plurality of recesses extend through an entire thickness of the plurality of epitaxial layers. In certain embodiments, the active layer is arranged between a p-type layer and an n-type layer of the LED chip and the plurality of recesses extend through an entire thickness of the p-type layer, the active layer, and the n-type layer. In certain embodiments, the light-altering material is arranged at least partially in the plurality of recesses. In certain embodiments, the light-altering material and a reflective layer are arranged in each of the plurality of recesses. In certain embodiments, a reflective layer is registered in at least one recess of the plurality of recesses. In certain embodiments, the reflective layer is arranged between the monolithic substrate and the light-altering material. In certain embodiments, each discrete active layer portion of the plurality of discrete active layer portions comprises an anode contact and a cathode contact. The plurality of discrete active layer portions may be electrically connected in series or each discrete active layer portion of the plurality of discrete active layer portions may be independently addressable. In certain embodiments, the wavelength conversion element comprises a superstrate and a lumiphoric material. In certain embodiments, the lumiphoric material is arranged between the superstrate and the monolithic substrate of the LED chip. In certain embodiments, the wavelength conversion element comprises phosphor-in-glass or a ceramic phosphor plate. In certain embodiments, the submount further comprises electrical traces that are electrically connected to the LED chip, and one or more package contacts that are electrically connected to the electrical traces, wherein the one or more package contacts are arranged on a same face of the submount as the electrical traces and the one or more package contacts are uncovered by the light-altering material. In certain embodiments, the submount further comprises electrical traces that are electrically connected to the LED chip, one or more package contacts that are arranged on an opposite face of the submount than the electrical traces, and one or more electrically conductive vias arranged in the submount and electrically coupled between the electrical traces and the one or more package contacts. In certain embodiments, the LED chip is mounted on an LED mounting surface of the submount and the light-altering material is arranged to entirely cover the LED mounting surface outside peripheral edges of the LED chip.

In another aspect, an LED package comprises: a submount; an LED chip on the submount, the LED chip comprising: an active layer forming a plurality of active layer portions; and a substrate forming a plurality of discrete substrate portions and each discrete substrate portion of the plurality of discrete substrate portions is registered with a corresponding active layer portion of the plurality of active layer portions, wherein the plurality of active layer portions are arranged between the submount and the plurality of discrete substrate portions; a wavelength conversion element on the plurality of discrete substrate portions; and a light-altering material on the submount, the light-altering material arranged around a perimeter of the LED chip and around a perimeter of the wavelength conversion element. In certain embodiments, the substrate is a light transmissive substrate. In certain embodiments, the light-altering material is arranged between adjacent discrete substrate portions of the plurality of discrete substrate portions. In certain embodiments, the light-altering material is arranged between the plurality of active layer portions and the submount. In certain embodiments, the light-altering material is arranged between the plurality of active layer portions and the submount. In certain embodiments, the plurality of active layer portions are electrically connected in series. In certain embodiments, each active layer portion of the plurality of active layer portions is independently addressable. In certain embodiments, the wavelength conversion element comprises a superstrate and a lumiphoric material. In certain embodiments, the lumiphoric material is arranged between the superstrate and the plurality of discrete substrate portions. In certain embodiments, the wavelength conversion element comprises phosphor-in-glass or a ceramic phosphor plate. In certain embodiments, the submount further comprises electrical traces that are electrically connected to the LED chip, and one or more package contacts that are electrically connected to the electrical traces, wherein the one or more package contacts are arranged on a same face of the submount as the electrical traces and the one or more package contacts are uncovered by the light-altering material. In certain embodiments, the submount further comprises electrical traces that are electrically connected to the LED chip, one or more package contacts that are arranged on an opposite face of the submount than the electrical traces, and one or more electrically conductive vias arranged in the submount and electrically coupled between the electrical traces and the one or more package contacts.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
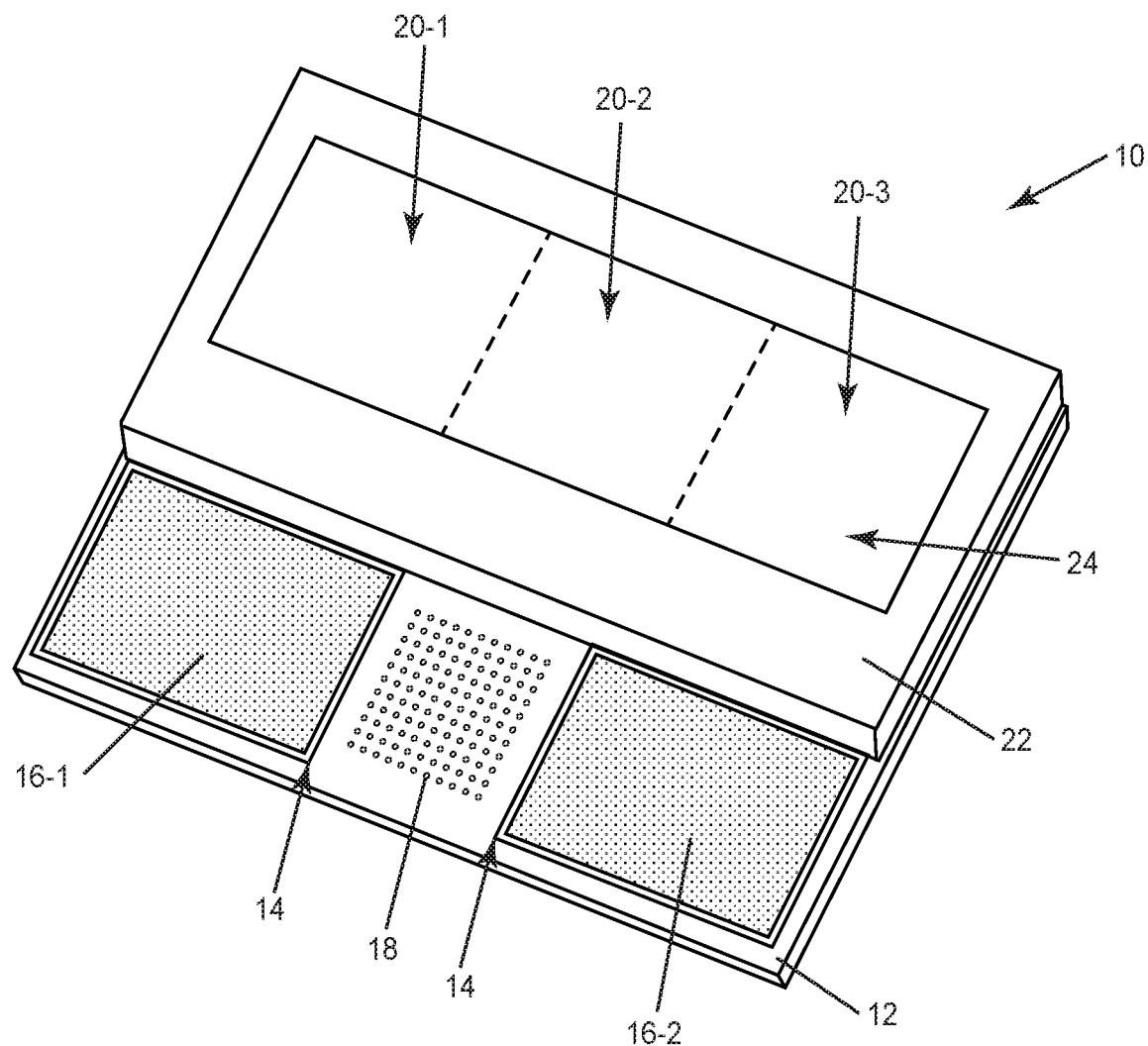
FIG. 1 is a perspective view of a light-emitting diode (LED) package according to embodiments disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates in various aspects to solid-state light emitting devices including light-emitting diodes (LEDs), and more particularly to packaged LEDs. LED packages are disclosed that include an LED chip that includes multiple discrete active layer portions mounted on a submount. The LED packages may further include wavelength conversion elements and light-altering materials. The multiple discrete active layer portions may be electrically connected in series, parallel, or in individually addressable arrangements. The LED chip with the multiple discrete active layer portions may provide the LED package with improved brightness, improved alignment, simplified manufacturing, and reduced costs compared with conventional LED packages that include multiple discrete LED chips.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to, buffer layers, nucleation layers, super lattice structures, un-doped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. For example, the active LED structure for various LEDs may emit blue light with a peak wavelength range of approximately 430 nanometers (nm) to 480 nm, green light with a peak wavelength range of 500 nm to 570 nm, or red light with a peak wavelength range of 600 nm to 650 nm. The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In certain embodiments, the combination of the LED chip and the one or more phosphors emits a generally white combination of light. The one or more phosphors may include yellow (e.g., YAG:Ce), green (e.g., LuAg:Ce), and red (e.g., $Ca_{1-x-y}Sr_x$-$Eu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

Light emitted by the active layer or region of the LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer may be arranged between the metal reflector layer and first and second electrical contacts, wherein the first electrical contact is arranged in conductive electrical communication with a first semiconductor layer, and the second electrical contact is arranged in conductive electrical communication with a second semiconductor layer. In certain embodiments, the first and second electrical contacts themselves may be configured as mirror layers. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In certain embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (for example, at least 80% reflective) may be considered a reflective material. In the case of ultraviolet (UV) LEDs, appropriate materials may be selected to provide a desired, and in certain embodiments high reflectivity; and/or a desired, and in certain embodiments low, absorption. In certain embodiments, a "light-transmissive" material may be configured to transmit at least 50% of emitted radiation of a desired wavelength. In certain embodiments, an initially "light-transmissive" material may be altered to be a "light-absorbing material" that transmits less than 50% of emitted radiation of a desired wavelength with the addition of one or more light-absorbing materials, such as opaque or non-reflective materials including grey, dark, or black particles or materials.

The present disclosure can be useful for LED chips having a variety of geometries, such as vertical geometry or lateral geometry. A vertical geometry LED chip typically includes anode and cathode connections on opposing sides of the LED chip. A lateral geometry LED chip typically includes both anode and cathode connections on the same side of the LED chip that is opposite a substrate, such as a growth substrate. Certain embodiments disclosed herein relate to the use of flip chip LED devices in which a light transmissive substrate represents an exposed light emitting surface.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure.

FIG. 1 is a perspective view of an LED package 10 according to embodiments disclosed herein. The LED package 10 includes a submount 12 that can be formed of many different materials with a preferred material being electrically insulating. Suitable materials include, but are not limited to ceramic materials such as aluminum oxide or alumina, AlN, or organic insulators like polyimide (PI) and polyphthalamide (PPA). In other embodiments, the submount 12 can comprise a printed circuit board (PCB), sapphire, Si or any other suitable material. For PCB embodiments, different PCB types can be used such as standard FR-4 PCB, metal core PCB, or any other type of PCB. At least a portion of a metal pattern 14 is visible on the submount 12. Package contacts 16-1, 16-2 comprise at least a portion of the metal pattern 14 and include an anode contact and a cathode contact configured to receive an electrical connection from a power source external to the LED package 10. In certain embodiments, a portion 18 of the submount 12 includes identification or other information about the LED package 10, including a quick response (QR) code, a bar code, or alphanumeric information. In FIG. 1, the portion 18 is illustrated between the package contacts 16-1, 16-2. However, in other embodiments, the portion 18 that includes identification or other information may be located on other areas of the submount 12.

A plurality of LED chips 20-1 to 20-3 are visible on the submount 12, and a light-altering material 22 is arranged around a perimeter of the LED chips 20-1 to 20-3 on a surface of the submount 12. While the LED package 10 is designed with three LED chips 20-1 to 20-3, any number of LED chips are possible. In certain embodiments, the light-altering material 22 is configured to redirect or reflect laterally-emitting light from the LED chips 20-1 to 20-3 toward a desired emission direction. In other embodiments, the light-altering material 22 may block or absorb at least a portion of any laterally-emitting light from the LED chips 20-1 to 20-3 that would otherwise escape the LED package 10 with high or wide emission angles. The light-altering material 22 may partially cover the submount 12 outside of where the LED chips 20-1 to 20-3 are located. In this regard, the light-altering material 22 may cover portions of the metal pattern 14 that extend from the package contacts 16-1, 16-2 to the LED chips 20-1 to 20-3. The light-altering material 22 may be adapted for dispensing, or placing, and may include many different materials including light-reflective materials that reflect or redirect light, light-absorbing materials that absorb light, and materials that act as a thixotropic agent. In certain embodiments, the light-altering material 22 may include at least one of fused silica, fumed silica, and titanium dioxide ($TiO_2$) particles suspended in a binder, such as silicone or epoxy. In certain embodiments, the light-altering material 22 may comprise a white color to reflect and redirect light. In other embodiments, the light-altering material 22 may comprise an opaque or black color for absorbing light and increasing contrast of the LED package 10. The light-altering material 22 can be dispensed or deposited in place using an automated dispensing machine where any suitable size and/or shape can be formed. The light-altering material 22 may include a cross-sectional profile comprising a planar top surface with vertical side surfaces or a curved top surface with vertical side surfaces. In other embodiments, the light-altering material 22 may comprise other shapes, including a planar or curved top surface with non-planar or non-vertical side surfaces. In certain embodiments, at least a portion of the light-altering material 22 may extend to one or more edges of the submount 12. In FIG. 1, the light-altering material 22 extends to three edges of the submount 12, but does not extend to a fourth edge of the submount 12, thereby leaving the package contacts 16-1, 16-2 uncovered to allow for electrical connections to the LED package 10.

In certain embodiments, a wavelength conversion element 24 is arranged over the plurality of LED chips 20-1 to 20-3 on the submount 12. In certain embodiments, the light-altering material 22 is also arranged around a perimeter of the wavelength conversion element 24. In certain embodiments, the wavelength conversion element 24 includes one or more lumiphoric materials. Lumiphoric materials as described herein may include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, spray coating, inkjet printing, or the like). In certain embodiments, lumiphoric materials may be deposited utilizing one or more applications of a spray coating after the LED chips 20-1 to 20-3 are mounted on the submount 12, as described in commonly-assigned U.S. Patent Application Publication No. 2017/0098746. In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In certain embodiments, one or more phosphors may include yellow phosphors (e.g., YAG:Ce), green phosphors (LuAg:Ce), and red phosphors (Cai-x-ySrxEuyAlSiN3) and combinations thereof. In certain embodiments, the wavelength conversion element 24 includes embodiments as described in commonly-assigned U.S. Patent Application Publication No. 2018/0033924, which is hereby incorporated by reference herein.

Figure 2:
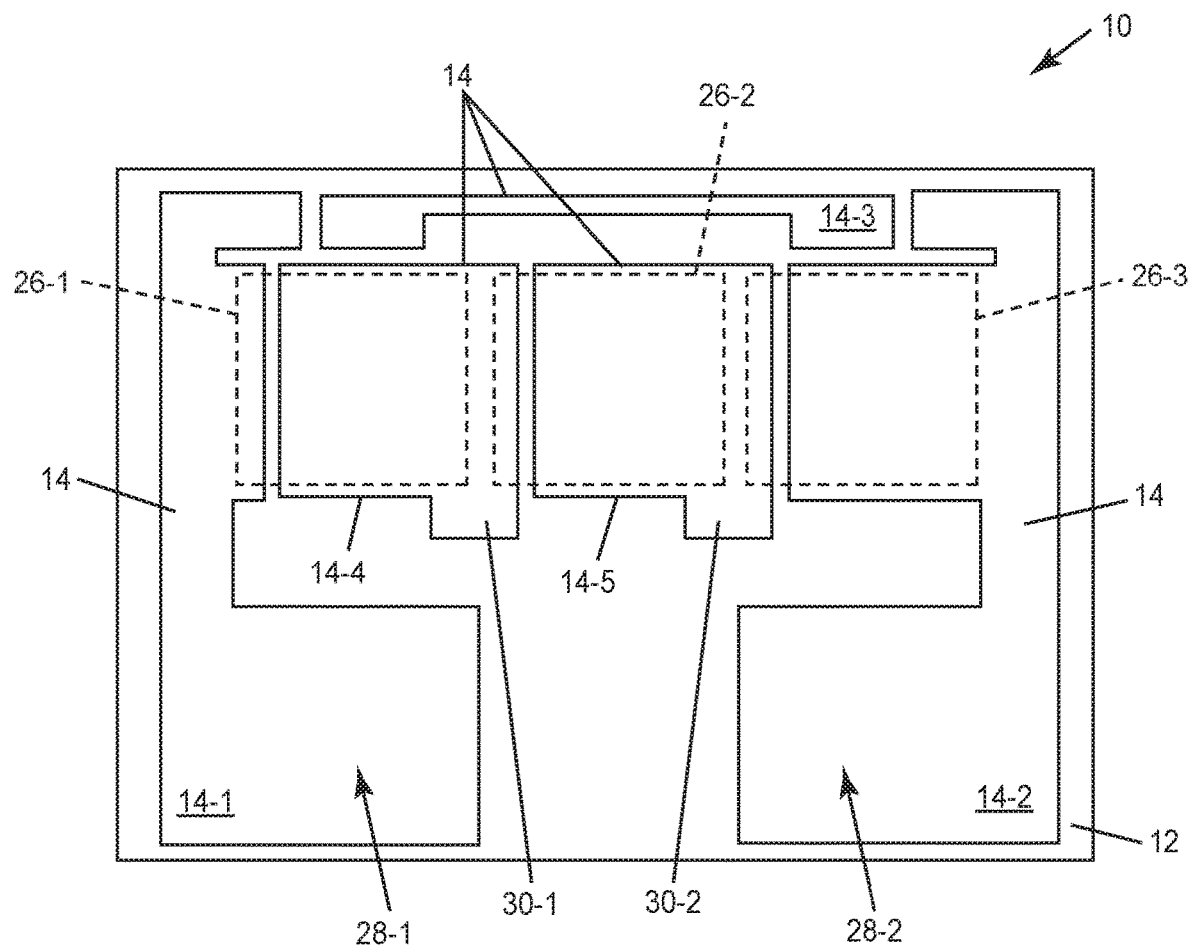
FIG. 2 illustrates a top view of the LED package of FIG. 1 in a partially assembled state.

FIG. 2 illustrates a top view of the LED package 10 of FIG. 1 in a partially assembled state. In FIG. 2, the metal pattern 14 on the submount 12 is visible. The metal pattern 14 includes a plurality of metal traces 14-1 to 14-5, which may also be referred to as electrical traces. Each metal trace 14-1 to 14-5 includes a continuous metal formed on a surface of the submount 12, and each metal trace 14-1 to 14-5 is discontinuous with each other. The metal pattern 14 forms a plurality of die attach pads 26-1 to 26-3, or a plurality of mounting areas, that are indicated by dashed-line boxes in FIG. 2. The die attach pads 26-1 to 26-3 are configured to receive a plurality of discrete LED chips. For example, the die attach pad 26-1 includes a portion of the metal trace 14-1 and a portion of the metal trace 14-4. Accordingly, an anode of an LED chip may be mounted or attached to the metal trace 14-1 while a cathode of the LED chip may be mounted or attached to the metal trace 14-4. In a similar manner, the die attach pad 26-2 includes a portion of the metal trace 14-4 and a portion of the metal trace 14-5, and the die attach pad 26-3 includes a portion of the metal trace 14-2 and a portion of the metal trace 14-5. Additionally, a portion of the metal trace 14-1 and a portion of the metal trace 14-2 form bond pads 28-1, 28-2, respectively. The bond pads 28-1, 28-2 form a portion of the package contacts 16-1, 16-2 of FIG. 1. In this regard, the metal trace 14-1 is continuous with at least a portion of the die attach pad 26-1 and the bond pad 28-1, and the metal trace 14-2 is continuous with at least a portion of the die attach pad 26-3 and the bond pad 28-2. In certain embodiments, the metal pattern 14 includes one or more test tabs 30-1, 30-2 that allow for individual testing of LED chips that are mounted to the die attach pads 26-1 to 26-3. For example, in FIG. 2, the metal trace 14-4 includes the test tab 30-1, and the metal trace 14-5 includes the test tab 30-2. The one or more test tabs 30-1, 30-2 are outside an area of the die attach pads 26-1 to 26-3. In that regard, the one or more test tabs 30-1, 30-2 are accessible after LED chips are mounted in the LED package 10.

The metal pattern 14 may include any number of electrically conductive materials. In some embodiments, the metal pattern 14 includes at least one of the following: copper (Cu) or alloys thereof, nickel (Ni) or alloys thereof, nickel chromium (NiCr), gold (Au) or alloys thereof, electroless Au, electroless silver (Ag), NiAg, Al or alloys thereof, titanium tungsten (TiW), titanium tungsten nitride (TiWN), electroless nickel electroless palladium immersion gold (ENEPIG), electroless nickel immersion gold (ENIG), hot air solder leveling (HASL), and organic solderability preservative (OSP). In certain embodiments, the metal pattern 14 includes a first layer of Cu or Ni followed by a layer of ENEPIG or ENIG that conformally covers a top and sidewalls of the first layer of Cu or Ni.

For individual LED chips that are mounted to the die attach pads 26-1 to 26-3 in FIG. 2, tolerances are usually provided to assist with LED chip alignment on the die attach pads 26-1 to 26-3. Pick and place tools or other placement techniques are usually employed to separately mount each individual LED chip on a corresponding one of the die attach pads 26-1 to 26-3, or mounting areas. Any misalignment of LED chips could result in poor electrical connections with the underlying metal pattern 14 as well as an irregular emission area of the LED package 10 formed when LED chips are misaligned with each other. Additionally, spaces that are formed between sidewalls of individual LED chips form additional interfaces for light to interact before escaping the LED package 10. The additional interfaces may even form areas where light from the LED chips can be lost to absorption without exiting the LED package 10. In a typical singulation process for individual LED chips, sidewalls of the LED chips are formed by a sawing or dicing process that can include mechanical or laser sawing. In this manner, sidewalls of the LED chips may form uneven surfaces or surfaces with imperfections that can further absorb light from the LED chips. Additionally, any material that may be arranged to fill the spaces between the individual chips may also form interfaces where light absorption can take place.

Figure 3A:
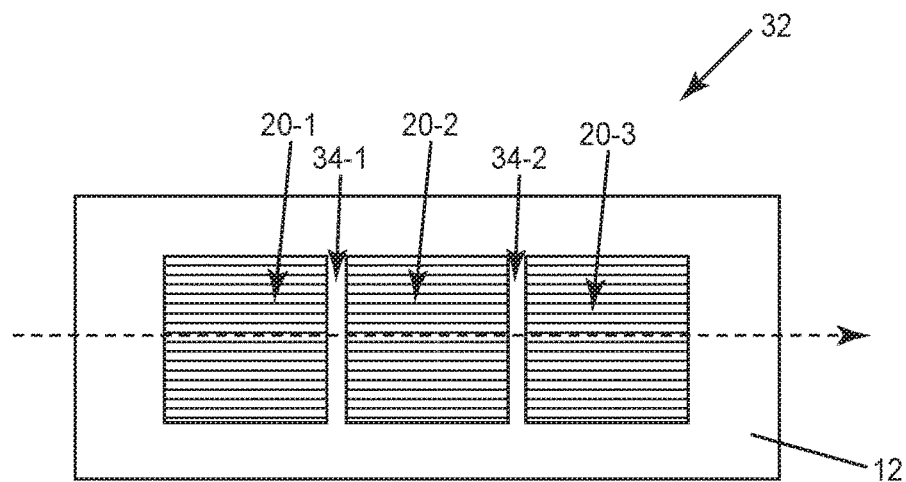
FIG. 3A is a top view of an exemplary LED device with a plurality of LED chips arranged on a submount.
Figure 3B:
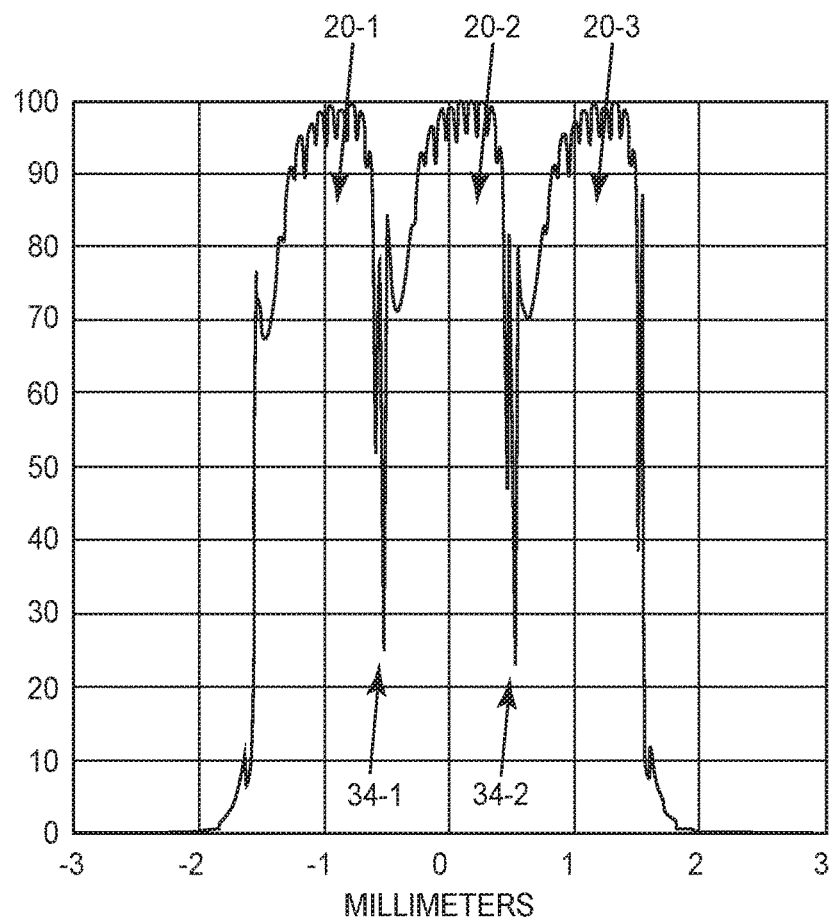
FIG. 3B is a line plot of an illumination profile in a direction indicated by the dashed arrow line of FIG. 3A when the LED chips are electrically activated.

FIG. 3A is a top view of an exemplary LED device 32 with the plurality of LED chips 20-1 to 20-3 arranged on the submount 12 in a manner similar to LED chips being mounted on the die attach pads 26-1 to 26-3 or mounting areas of FIG. 2. Spaces 34-1, 34-2 are formed between adjacent ones of the LED chips 20-1 to 20-3. In this regard, the spaces 34-1, 34-2 correspond to areas that are devoid of light generating active regions of the LED chips 20-1 to 20-3. As such, the spaces 34-1, 34-2 correspond to generally darker emission regions. FIG. 3B is a line plot of an illumination profile in a direction indicated by the dashed arrow line of FIG. 3A when the LED chips 20-1 to 20-3 are electrically activated. The y-axis of the plot is luminance arbitrary units and the x-axis is a relative distance in millimeters (mm) a sensor moves across the LED chips 20-1 to 20-3. Relative positions of the LED chips 20-1 to 20-3 and the spaces 34-1, 34-2 are indicated on the line plot. As illustrated, the spaces 34-1, 34-2 between the adjacent ones of the LED chips 20-1 to 20-3 provide notable decreases in luminance. As such, the spaces 34-1, 34-2 can form the appearance of dark lines or lines of reduced luminance during operation.

Figure 4A:
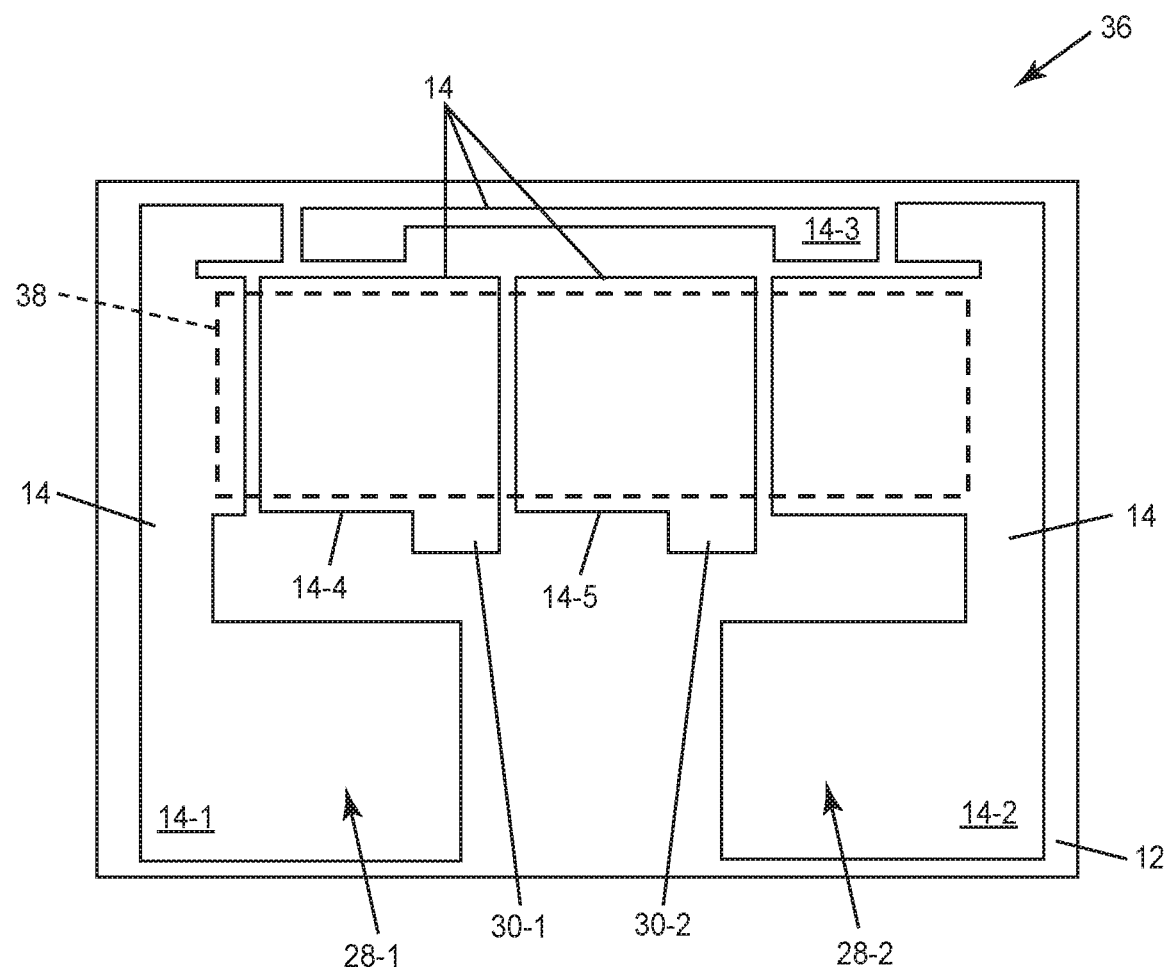
FIG. 4A is a top view of an LED package in a partially assembled state according to embodiments disclosed herein.

FIG. 4A is a top view of an LED package 36 in a partially assembled state that includes a single mounting area 38 according to embodiments disclosed herein. The LED package 36 may include the submount 12, the metal pattern 14 with the plurality of metal traces 14-1 to 14-5, the bond pads 28-1, 28-2, and the test tabs 30-1, 30-2 as previously described for FIG. 2. In FIG. 4A, the mounting area 38 is provided in place of the multiple die attach pads or mounting areas 26-1 to 26-3 of FIG. 2. As such, the mounting area 38 includes one or more portions of the metal traces 14-1, 14-2, 14-4, and 14-5. In certain embodiments and as will be later described in greater detail, the mounting area 38 corresponds to a die attach area for a single LED chip that includes multiple light emitting junctions formed on a common layer or a substrate. As such, the LED chip may comprise a monolithic multiple junction LED chip. In this manner, dark lines or areas of reduced luminance that are associated with spaces between discrete LED chips may be avoided.

Figure 4B:
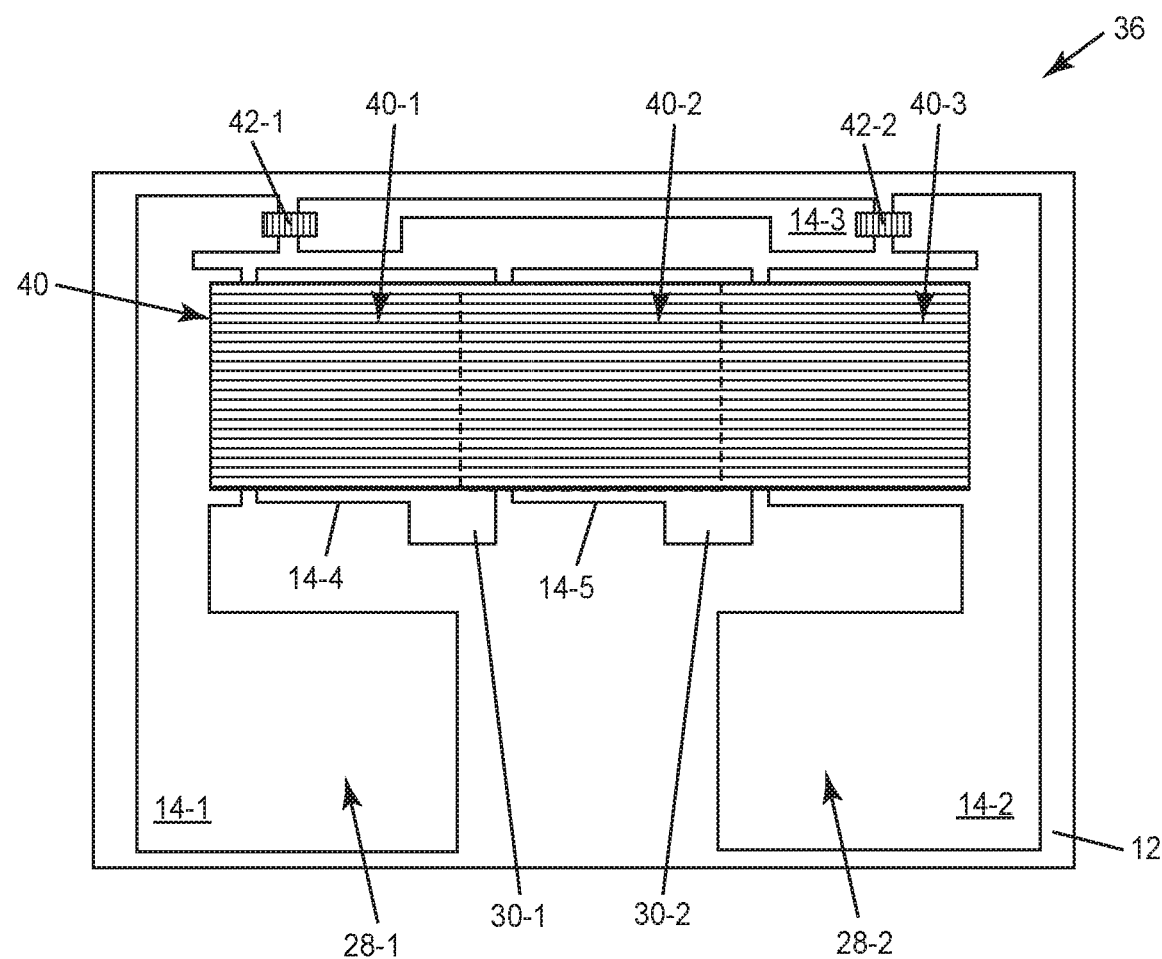
FIG. 4B is a top view of the LED package of FIG. 4A after an LED chip that includes multiple light emitting junctions is mounted according to embodiments disclosed herein.

FIG. 4B is a top view of the LED package 36 after an LED chip 40 that includes multiple light emitting junctions 40-1 to 40-3 is mounted on the mounting area 38 of FIG. 4A. As such, the LED chip 40 may be mounted to and electrically coupled to the metal traces 14-1, 14-2, 14-4, and 14-5. Vertical dashed lines are superimposed on the LED chip 40 to indicate boundaries of the multiple light emitting junctions 40-1 to 40-3 formed therein. In certain embodiments, the multiple light emitting junctions 40-1 to 40-3 are discrete from one another on a common layer or substrate of the LED chip 40 and each of the multiple light emitting junctions 40-1 to 40-3 may comprise separate anode and cathode contacts. As illustrated, a first metal trace 14-1 is continuous between the bond pad 28-1 and a first light emitting junction 40-1, and a second metal trace 14-2 is continuous between the bond pad 28-2 and a third light emitting junction 40-3. Fourth and fifth metal traces 14-4 and 14-5 are arranged as intermediate metal traces for providing electrical connections between adjacent ones of the multiple light emitting junctions 40-1 to 40-3. In this manner, external electrical connects may be applied at the bond pads 28-1, 28-2 (or the package contacts 16-1, 16-2 of FIG. 1) for electrically activating the multiple light emitting junctions 40-1 to 40-3 of LED chip 40. In certain embodiments, the four and fifth metal traces 14-4 and 14-5 are arranged to serially connect the multiple light emitting junctions 40-1 to 40-3. In other embodiments, the multiple light emitting junctions 40-1 to 40-3 may be connected in other arrangements, including parallel, and independently addressable configurations.

The LED package 36 may further include one or more electrostatic discharge (ESD) chips 42-1, 42-2. A first ESD chip 42-1 is attached or mounted to the first metal trace 14-1 and a third metal trace 14-3, and a second ESD chip 42-2 is attached or mounted to the third metal trace 14-3 and the second metal trace 14-2. In this regard, each of the ESD chips 42-1, 42-2 are electrically connected in series between the first metal trace 14-1 and the second metal trace 14-2. In this manner, the ESD chips 42-1, 42-2 are arranged in parallel with the multiple light emitting junctions 40-1 to 40-3 between the first metal trace 14-1 and the second metal trace 14-2. The one or more test tabs 30-1, 30-2 are configured to allow for individual testing of the multiple light emitting junctions 40-1 to 40-3 after the LED chip 40 and the ESD chips 42-1, 42-2 are mounted to the LED package 36. For example, the first light emitting junction 40-1 may be individually tested via electrical contacts to the first metal trace 14-1 and the test tab 30-1; a second light emitting junction 40-2 may be individually tested via electrical contacts to the test tabs 30-1, 30-2; and finally, the third light emitting junction 40-3 may be individually tested via electrical contacts to the test tab 30-2 and the second metal trace 14-2. Furthermore, subgroups of the light emitting junctions 40-1 to 40-3 may be tested together. For example, the light emitting junctions 40-1 and 40-2 may be tested as a pair via electrical contacts to the metal trace 14-1 and the test tab 30-2.

Figure 4C:
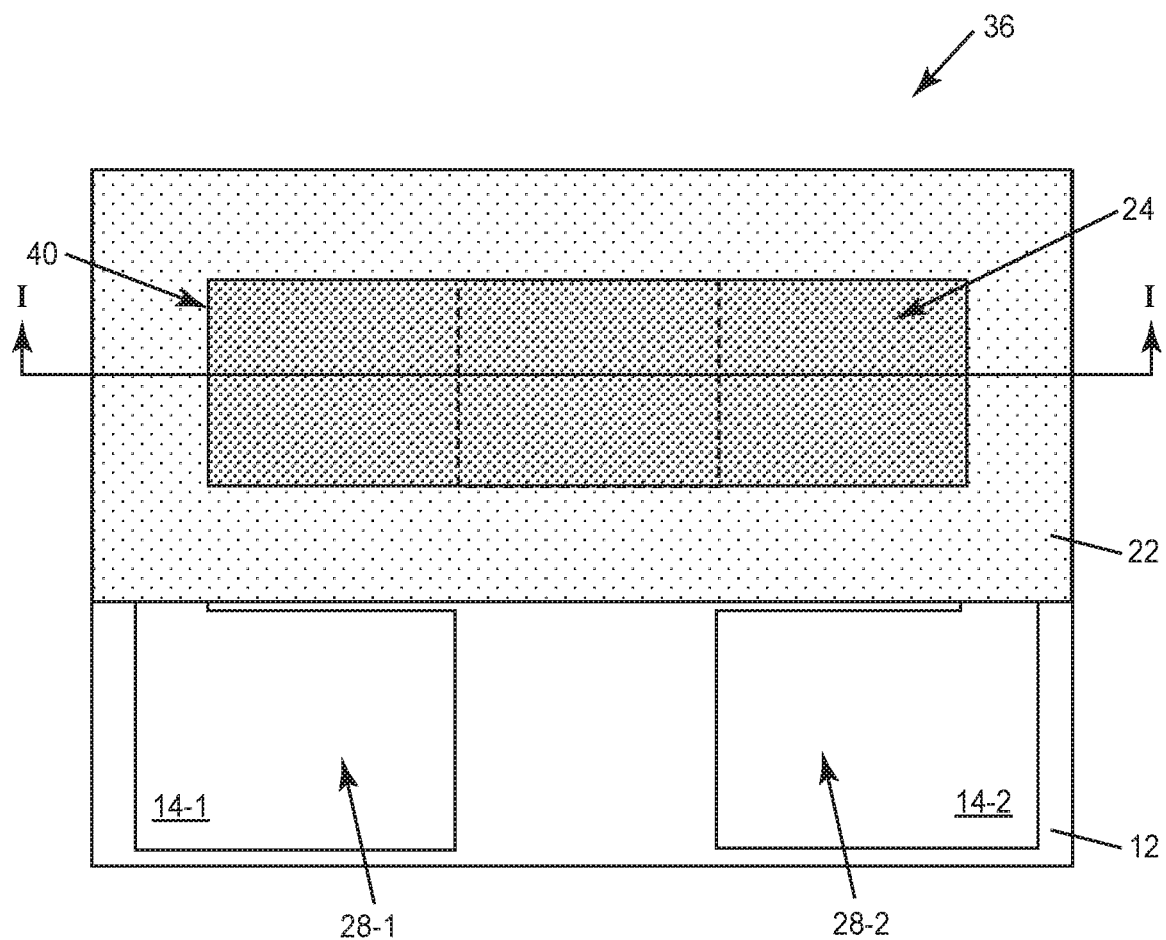
FIG. 4C is a top view of the LED package of FIG. 4B with the addition of a light-altering material and a wavelength conversion element according to embodiments disclosed herein.

FIG. 4C is a top view of the LED package 36 of FIG. 4B with addition of the light-altering material 22 and the wavelength conversion element 24 according to embodiments disclosed herein. The wavelength conversion element 24 is provided on or over the LED chip 40 and the light-altering material 22 is arranged around a perimeter of the LED chip 40 and around a perimeter of the wavelength conversion element 24. As previously described and depending on the application, the light-altering material 22 may be configured to redirect or reflect laterally-emitting light from the LED chip 40 toward a desired emission direction or absorb laterally-emitting light from the LED chip 40 for improved contrast. As illustrated, the light-altering material 22 is provide on the submount 12 to laterally surround peripheral boundaries of the LED chip 40 while also leaving at least a portion of each of the bond pads 28-1, 28-1 (or the package contacts 16-1, 16-2 of FIG. 1) uncovered to allow for electrical connections to the LED package 36.

Figure 4D:
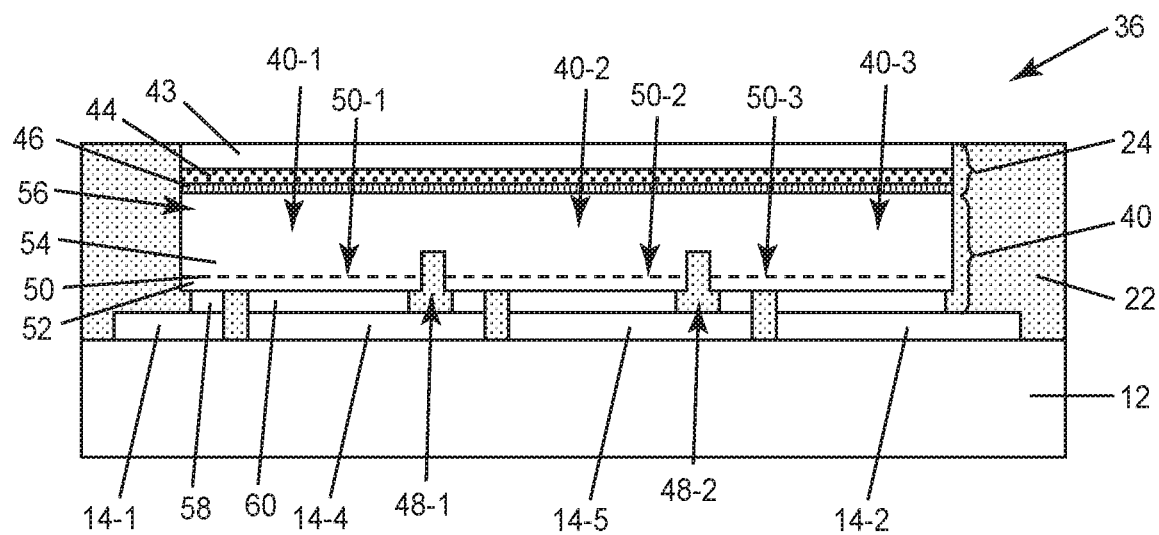
FIG. 4D is a cross-sectional view of the LED package of FIG. 4C taken along the sectional line I-I.

FIG. 4D is a cross-sectional view of the LED package 36 taken along the sectional line I-I of FIG. 4C. In FIG. 4D, the submount 12; the metal traces 14-1, 14-2, 14-4, 14-5; the light emitting junctions 40-1 to 40-3; the light-altering material 22; and the wavelength conversion element 24 are visible. The wavelength conversion element 24 includes a superstrate 43 that includes a lumiphoric material 44 disposed thereon. The term "superstrate" as used herein refers to an element placed on an LED chip that includes a lumiphoric material. The term "superstrate" is used herein, in part, to avoid confusion with other substrates that may be part of the semiconductor light emitting device, such as a growth or carrier substrate of the LED chip or a submount of an LED package. The term "superstrate" is not intended to limit the orientation, location, and/or composition of the structure it describes. In some embodiments, the superstrate 43 may be composed of, for example, sapphire, SiC, silicone, and/or glass (e.g., borosilicate and/or fused quartz). The superstrate 43 may be patterned to enhance light extraction from the LED chip 40 as described in commonly-assigned U.S. Provisional Application No. 62/661,359 entitled "Semiconductor Light Emitting Devices Including Superstrates With Patterned Surfaces" which is hereby incorporated by reference herein. The superstrate 43 may also be configured as described in previously-referenced U.S. Patent Application Publication No. 2018/0033924, also incorporated by reference herein. The superstrate 43 may be formed from a bulk substrate which is optionally patterned and then singulated. In certain embodiments, the patterning of the superstrate 43 may be performed by an etching process (e.g., wet or dry etching). In certain embodiments, the patterning of the superstrate 43 may be performed by otherwise altering the surface, such as by a laser or saw. In some embodiments, the superstrate 43 may be thinned before or after the patterning process is performed. In certain embodiments, the superstrate 43 comprises a generally planar upper surface that corresponds to a light emission area of the LED package 36. The lumiphoric material 44 may then be placed on the superstrate 43 by, for example, spraying and/or otherwise coating the superstrate 43 with the lumiphoric material 44. The superstrate 43 and the lumiphoric material 44 may be attached to the LED chip 40 using, for example, a layer of transparent adhesive 46. In certain embodiments, the layer of the transparent adhesive 46 may include silicone with a refractive index in a range of about 1.3 to about 1.6 that is less than a refractive index of the LED chip 40. In other embodiments, the wavelength conversion element 24 may comprise alternative configurations, such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements 24.

In FIG. 4D, the LED chip 40 is configured as a multiple-junction monolithic LED chip that includes the multiple light emitting junctions 40-1 to 40-3 that are discrete from one another. In certain embodiments, the light emitting junctions 40-1 to 40-3 are separated and initially isolated from one another by one or more recesses 48-1, 48-2 that are formed in the LED chip 40. The LED chip 40 may include a plurality of various epitaxial layers that collectively form the light emitting structure. In FIG. 4D, an active layer 50 is illustrated as a dashed horizontal line across the LED chip 40. In a flip-chip mounting arrangement, a p-type layer 52 is positioned between the active layer 50 and the submount 12, and the active layer 50 is positioned between an n-type layer 54 and the submount 12. The LED chip 40 may further include a substrate 56, such as a growth substrate for the LED chip 40. The substrate 56 may include sapphire, SiC, AlN, or GaN. In particular embodiments, the substrate 56 comprises a light transmissive substrate such as sapphire or SiC. As illustrated, the recesses 48-1, 48-2 are formed through an entire thickness of the p-type layer 52, through an entire thickness of the active layer 50, and at least a portion of the n-type layer 54 to form the discrete light emitting junctions 40-1 to 40-3. In particular, the recesses 48-1, 48-2 divide the active layer 50 in to a plurality of discrete active layer portions 50-1 to 50-3 that are electrically isolated from one another. In certain embodiments, the recesses 48-1, 48-2 are formed through an entire thickness of the n-type layer 54 to reach a less conductive portion of the LED chip 40, such as an undoped or unintentionally doped layer of the LED chip 40. In certain embodiments, the recesses 48-1, 48-2 are formed through an entire thickness of any epitaxial layers of the LED chip 40 to either reach or extend into the substrate 56. As such, the substrate 56 forms a monolithic substrate that supports each of the light emitting junctions 40-1 to 40-3. For embodiments where the recesses 48-1, 48-2 do not extend entirely to the substrate 56, one or more epitaxial layers of the LED chip 40 may also extend across all of the light emitting junctions 40-1 to 40-3. Each of the light emitting junctions 40-1 to 40-3 may include a separate anode 58 and a separate cathode 60 that are configured to provide various electrical connections to the metal traces 14-1, 14-2, 14-4, 14-5 when the LED chip 40 is flip-chip mounted to the substrate 56 in a direct attach configuration. In FIG. 4D, the light emitting junctions 40-1 to 40-3 are serially connected between the first metal trace 14-1 and the second metal trace 14-2. For, the cathode 60 of the first light emitting junction 40-1 and the anode 58 of the second light emitting junction 40-2 are electrically connected to the same metal trace 14-4.

When the LED chip 40 is electrically activated, light generated in the plurality of active layer portions 50-1 to 50-3 may overlap upon passing through the monolithic substrate 56 to appear as a more uniform emission from the LED chip 40. As such, the LED chip 40 may provide similar electrical benefits of a string of serially connected individual LED chips as described for FIGS. 1 and 2 without the associated illumination gaps or additional interfaces for light to potentially be lost to absorption. In certain embodiments, the LED chip 40 may provide increased brightness or luminance as compared with three individual LED chips in the same package. In this regard, the recesses 48-1, 48-2 between the light emitting junctions 40-1 to 40-3 of the LED chip 40 may be configured with narrower dimensions than tolerances required for the spaces (e.g., 34-1, 34-2 of FIG. 3A) between separate LED chips (e.g., 20-1 to 20-3 of FIG. 3A), thereby increasing chip area for a same footprint or light emitting area of the LED package 36. By way of an example, a particular light emitting area for the LED package 36 may comprise a width of 1050 microns (μm) and a length of 3180 μm, the LED chip 40 (with three light emitting junctions 40-1 to 40-3) may provide an increase in chip area of at least 4% compared with three discrete LED chips in the same light emitting area. For a light emitting area with a width of 1050 μm and a length of 2115 μm, the LED chip 40 (configured with two light emitting junctions) may provide an increase in chip area of at least 3% compared with two discrete LED chips in the same area. In a similar manner, configurations of the LED chip 40 with four or five light emitting junctions may provide an increase in chip area of 5% or more compared with four or five discrete LED chips in the same areas.

As illustrated in FIG. 4D, the light-altering material 22 may be arranged around a perimeter or peripheral edge of the LED chip 40 to redirect laterally emitting light in a desired emission direction of the LED package 36. The light-altering material 22 may also be arranged between the LED chip 40 and the submount 12 in various locations to provide further brightness improvements, including in gaps formed between various pairs of the metal traces (e.g., 14-1, 14-4 or 14-4, 14-5 or 14-5, 14-2), in gaps between the anodes 58 and the cathodes 60 of each of the light emitting junctions 40-1 to 40-3, and at least partially or completely filling the recesses 48-1, 48-2. In certain embodiments, the light-altering material 22 may be dispensed or otherwise applied to the submount 12 around the LED chip 40, and the light-altering material 22 may fill such locations between the LED chip 40 and the submount 12 by a wicking action. In certain embodiments, the light-altering material 22 may be arranged around a perimeter or peripheral edge of the wavelength conversion element 24 to redirect light from one or more of the active layer portions 50-1 to 50-3 and the lumiphoric material 44 from laterally escaping through the wavelength conversion element 24.

The LED chip 40 may also provide manufacturing-related benefits for fabrication of the LED package 36. In particular, the LED chip 40 may be initially formed with less chip dicing steps than forming multiple discrete LED chips, thereby improving cycle time and costs associated with chip fabrication. Additionally, the LED package 36 may be assembled with a single mounting step for the LED chip 40, rather that multiple mounting steps for discrete LED chips, thereby improving cycle time and costs associated with package fabrication. The single mounting step for the LED chip 40 will also avoid misalignment problems associated with separately mounting discrete LED chips. In conventional applications, variations in heights or thicknesses of separately mounted discrete LED chips may create uneven mounting surfaces for the wavelength conversion element 24. In this manner, the wavelength conversion element 24 may not uniformly contact each of the discrete LED chips when thickness variations are present, thereby forming spaces or gaps between the wavelength conversion element 24 and the discrete LED chips. As such, the spaces or gaps formed by thickness variations may create areas of the wavelength conversion element 24 that are in poor thermal contact with the LED chips and in operation, these areas can overheat. According to embodiments disclosed herein, the common or monolithic substrate 56 of the LED chip 40 may form a more uniform flat surface that provides improved thermal contact between the wavelength conversion element 24 and the LED chip 40. In certain embodiments, the substrate 56 may be subjected to a planarization step, such as polishing or grinding, to further improve uniformity and flatness before the wavelength conversion element 24 is attached.

Figure 5:
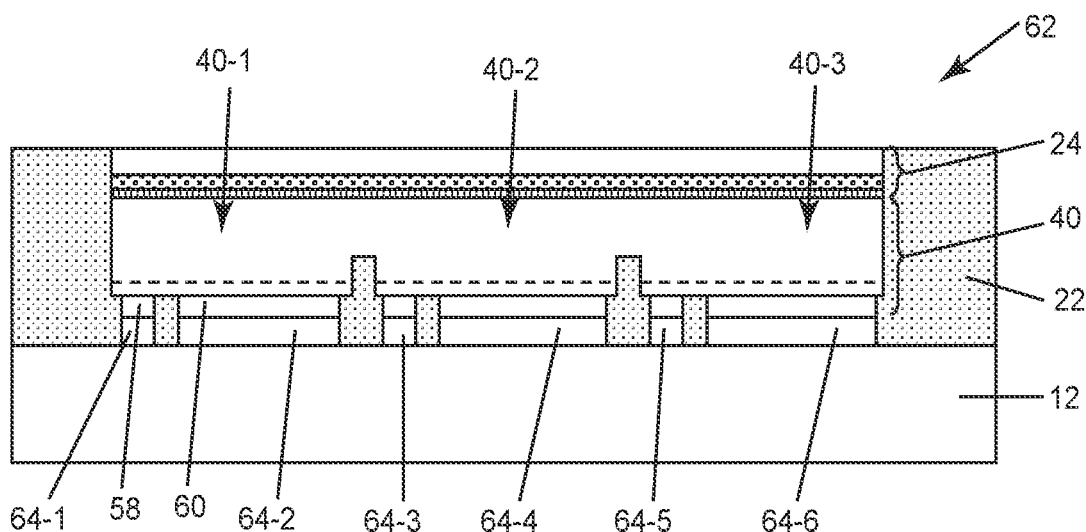
FIG. 5 is a cross-sectional view of an LED package that is similar to the LED package of FIG. 4D, but with alternative electrical connections according to embodiments disclosed herein.

FIG. 5 is a cross-sectional view of an LED package 62 that is similar to the LED package 36 of FIG. 4D, but with alternative electrical connections of the light emitting junctions 40-1 to 40-3 of the LED chip 40. The LED package 62 includes the LED chip 40 on the submount 12, with the wavelength conversion element 24 and the light-altering material 22 as previously described for FIG. 4D. In FIG. 5, a plurality of metal traces 64-1 to 64-6 are arranged on the submount 12 in a different arrangement than the metal traces 14-1, 14-2, 14-4, 14-5 visible in FIG. 4D. In particular, each of the anodes 58 and cathodes 60 of the light emitting junctions 40-1 to 40-3 are mounted and electrically coupled to different ones of the metal traces 64-1 to 64-6. In this regard, the light emitting junctions 40-1 to 40-3 may be electrically coupled in parallel with one another in certain embodiments. In other embodiments, the metal traces 64-1 to 64-6 may be arranged such that the light emitting junctions 40-1 to 40-3 are independently addressable, thereby allowing each of the light emitting junctions 40-1 to 40-3 to separately turn on or off, or to be driven at different light outputs independently of one another.

Figure 6:
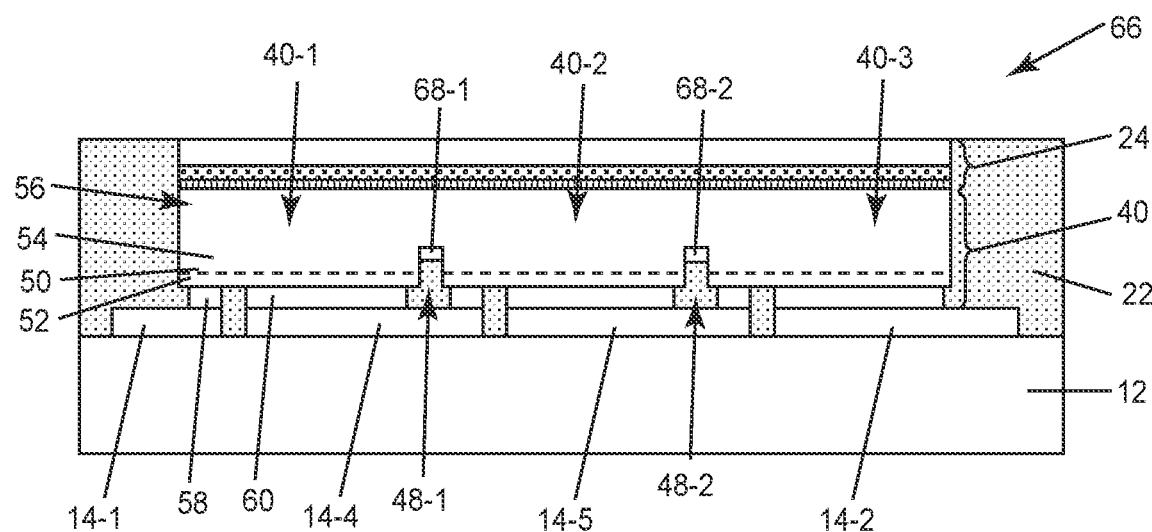
FIG. 6 is a cross-sectional view of an LED package that is similar to the LED package of FIG. 4D and further comprises one or more reflective layers that are registered with recesses of an LED chip according to embodiments disclosed herein.

FIG. 6 is a cross-sectional view of an LED package 66 that is similar to the LED package 36 of FIG. 4D and further comprises one or more reflective layers 68-1, 68-2 that are registered with the recesses 48-1, 48-2 of the LED chip 40. The LED chip 40 is arranged on the submount 12, with the wavelength conversion element 24 and the light-altering material 22 as previously described for FIG. 4D. When the LED chip 40 is electrically activated, light generated from each of the light emitting junctions 40-1 to 40-3 may pass through the common or monolithic substrate 56 of the LED chip 40 in a more uniform manner than with discrete LED chips. In some instances, light paths from the light emitting junctions 40-1 to 40-3 may experience one or more redirections at various interfaces, such as an interface defined between the wavelength conversion element 24 and the LED chip 40. Such interfaces may cause some light paths to be redirected back toward the LED chip 40 in directions toward the submount 12. As previously described, the light-altering material 22 may be arranged to fill empty spaces between the LED chip 40 and the submount 12 and may accordingly redirect light back toward wavelength conversion element 24. In FIG. 6, the LED chip 40 comprises one or more reflective layers 68-1, 68-2 that are registered with the recesses 48-1, 48-2 of the LED chip 40. In this manner, light traveling toward the submount 12 at the recesses 48-1, 48-2 may be reflected or redirected by the reflective layers 68-1, 68-2 alone or in combination with the light-altering material 22. The reflective layers 68-1, 68-2 may comprise a mirror layer that includes one or more of a metal layer and a dielectric reflective layer. In certain embodiments, the reflective layers 68-1, 68-2 comprise silicon dioxide ($SiO_2$). The LED chip 40 may additionally comprise one or more reflective layers or internal layers that are registered with the p-type layer 52 of the LED chip 40. As such, the combination of the reflective layers of the LED chip 40 that are registered with the p-type layer 52 and the reflective layers 68-1, 68-2 that are registered with the recesses 48-1, 48-2 provide improved light output for the LED package 66. In certain embodiments, the recesses 48-1, 48-2 comprise the reflective layers 68-1, 68-2 and the light-altering material 22. For example, the recesses 48-1, 48-2 may extend to and initially form exposed surfaces of an epitaxial layer or the substrate 56 that are registered between the light emitting junctions 40-1 to 40-3. The reflective layers 68-1, 68-2 may be deposited or otherwise formed on such exposed surfaces, with the remaining portion of the recesses 48-1, 48-2 filled with the light-altering material 22. For embodiments where the reflective layers 68-1, 68-2 comprise a metal, the reflective layers 68-1, 68-2 are arranged to contact less conductive regions, such as undoped epitaxial layers or the substrate 56 in the recesses 48-1, 48-2. In this manner, the light-altering material 22 is accordingly arranged in the remainder of the recesses 48-1, 48-2 to additionally provide electrical insulation and prevent electrical shorting of the n-type layer 54, the active layer 50, and the p-type layer 52. In other embodiments, the reflective layers 68-1, 68-2 may comprise an insulating material, e.g., a reflective dielectric material such as $SiO_2$, which completely fills the recesses 48-1, 48-2. In this manner, the light-altering material 22 is arranged between the reflective layers 68-1, 68-2 and the submount 12.

Figure 7A:
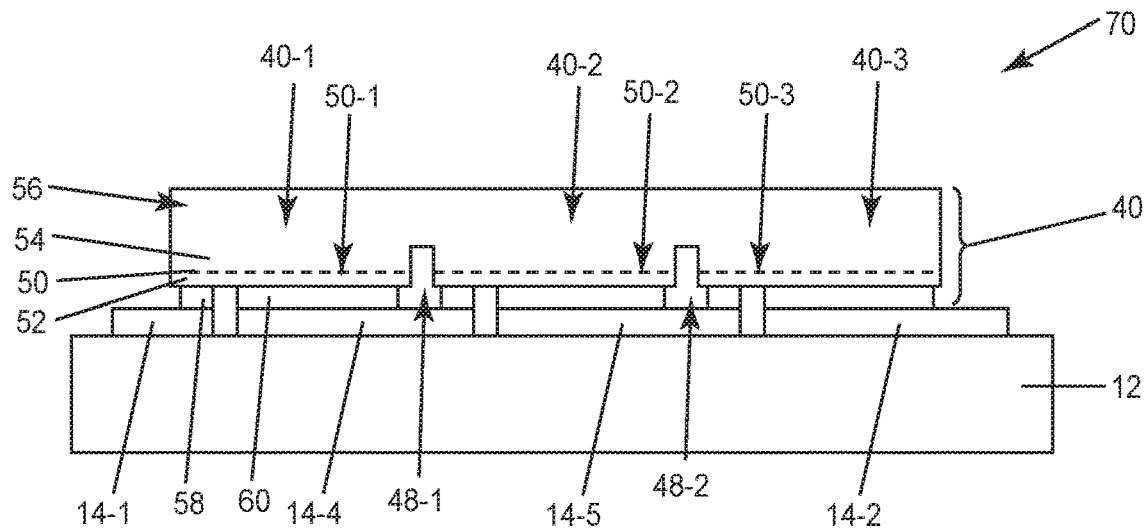
FIGS. 7A-7C are cross-sectional views of an LED package at various state of fabrication for an LED chip that includes a substrate that forms a plurality of substrate portions that are registered with multiple light emitting junctions according to embodiments disclosed herein.
Figure 7B:
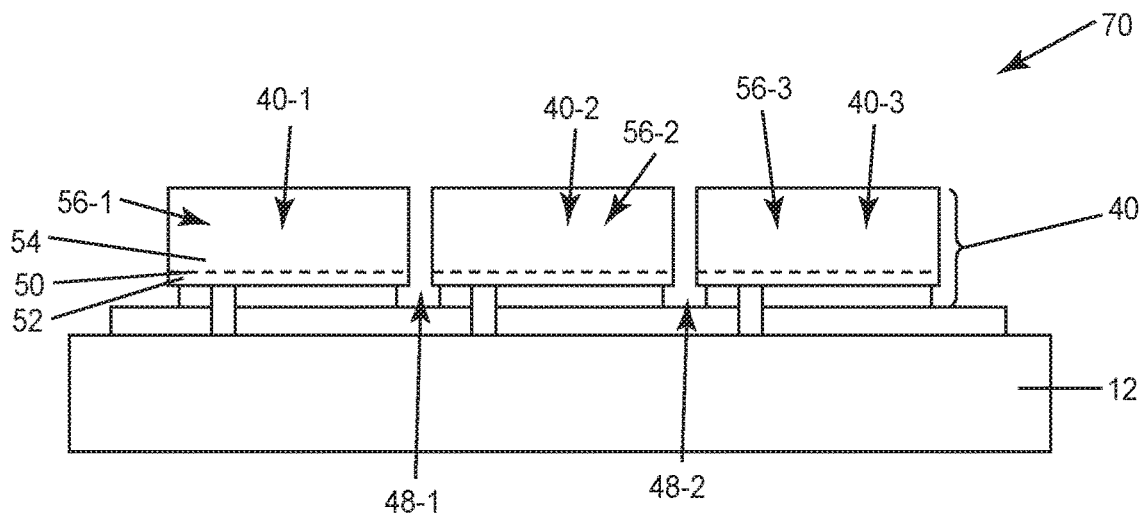
Figure 7C:
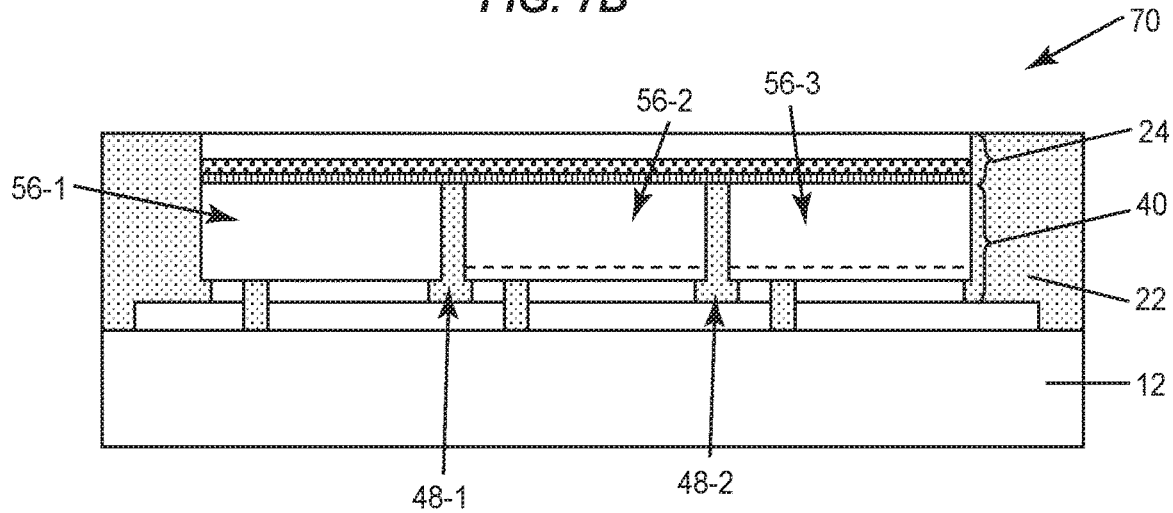

FIGS. 7A-7C are cross-sectional views of an LED package 70 at various state of fabrication for an alternative configuration of the LED chip 40 where the substrate 56 forms a plurality of discontinuous substrate portions 56-1 to 56-3 that are registered with the light emitting junctions 40-1 to 40-3. The LED chip 40 includes the substrate 56, the n-type layer 54, the active layer 50 that forms the plurality of active layer portions 50-1 to 50-3, the p-type layer 52, and the recesses 48-1, 48-2 as previously described. In FIG. 7A, the LED chip 40 is arranged or mounted on the submount 12 such that the anodes 58 and cathodes 60 of each of the light emitting junctions 40-1 to 40-3 are electrically coupled with the metal traces 14-1, 14-2, 14-4, 14-5 of the submount 12. In FIG. 7B, the substrate 56 of FIG. 7A is separated along the recesses 48-1, 48-2 of FIG. 7A to form the plurality of substrate portions 56-1 to 56-3 that are registered with different ones of the light emitting junctions 40-1 to 40-3 and the active layer portions 50-1 to 50-3. The substrate portions 56-1 to 56-3 may be formed by sawing or etching techniques through an entire thickness of the substrate 56 in certain embodiments. In FIG. 7C, the wavelength conversion element 24 and the light-altering material 22 are arranged as described for FIG. 4D. As such, the wavelength conversion element 24 is arranged in a continuous manner on each of the discontinuous substrate portions 56-1 to 56-3 of the LED chip 40. Additionally, the light-altering material 22 is arranged between adjacent ones of the substrate portions 56-1 to 56-3 of the LED chip 40.

Figure 8A:
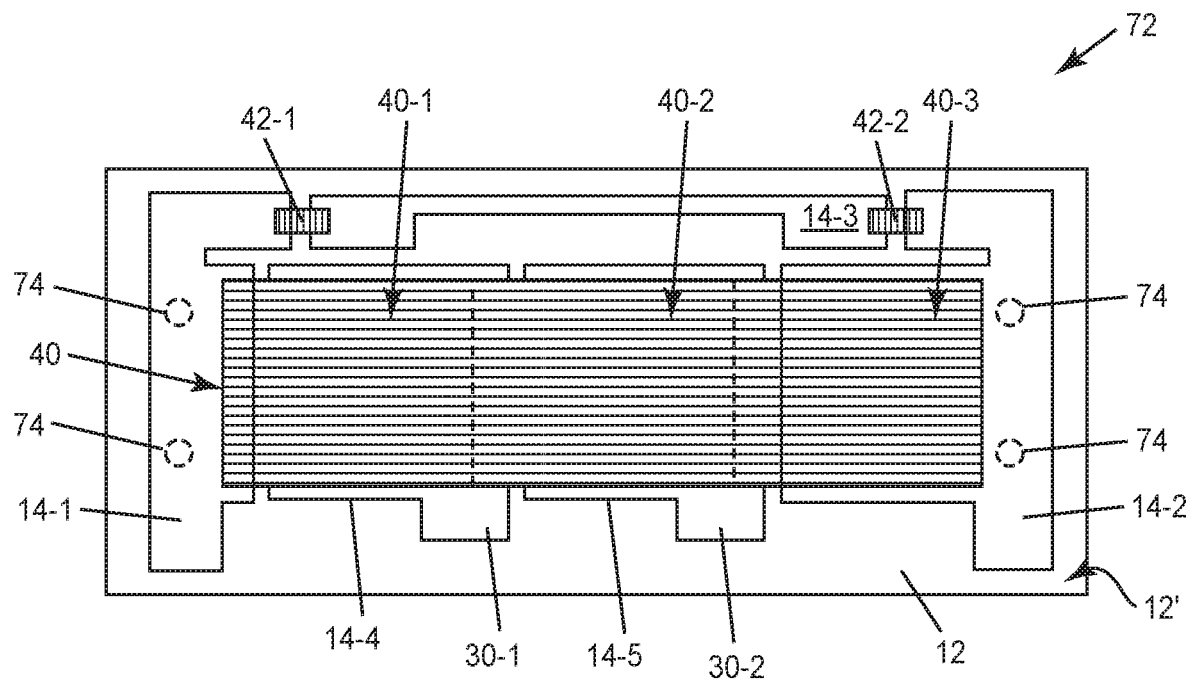
FIG. 8A illustrates a top view of an LED package that is similar to the LED package of FIG. 4B, except package contacts are not present on the same mounting face as where an LED chip is mounted according to embodiments disclosed herein.

Embodiments of the present disclosure are not limited to the previously described LED packages. In this regard, FIGS. 8A-9 illustrate various alternative configurations of LED packages with LED chips as disclosed herein. FIG. 8A illustrates a top view of an LED package 72 that is similar to the LED package 36 of FIG. 4B, except the package contacts 16-1, 16-2 are not present on an LED mounting face 12' of the submount 12 where the LED chip 40 is arranged. The LED package 72 additionally includes the metal traces 14-1 to 14-5; the one or more test tabs 30-1, 30-2; the ESD chips 42-1, 42-2, and the LED chip 40 as previously described. Accordingly, the LED chip 40 forms the light emitting junctions 40-1 to 40-3 that are mounted to and electrically coupled with the metal traces 14-1 to 14-5. One or more conductive vias 74 extend through the submount 12 to electrically connect the first metal trace 14-1 and the second metal trace 14-2 to a back face or surface of the submount 12 that is opposite the LED mounting face 12' of the submount 12. In this manner, external electrical connections to the LED package 72 may be connected on a different surface than the LED mounting face 12' and the one or more conductive vias 74 may form portions of electrically conductive paths to the LED chip 40.

Figure 8B:
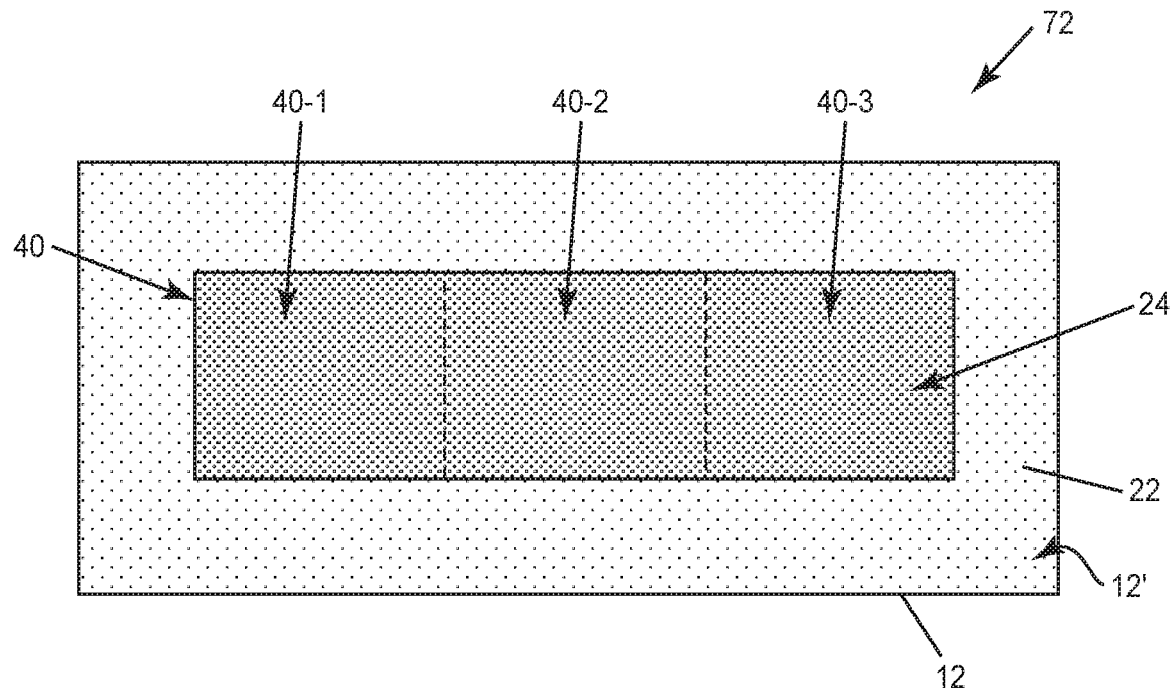
FIG. 8B illustrates a top view of the LED package of FIG. 8A with the addition of a wavelength conversion element and a light-altering material according to embodiments disclosed herein.
Figure 9:
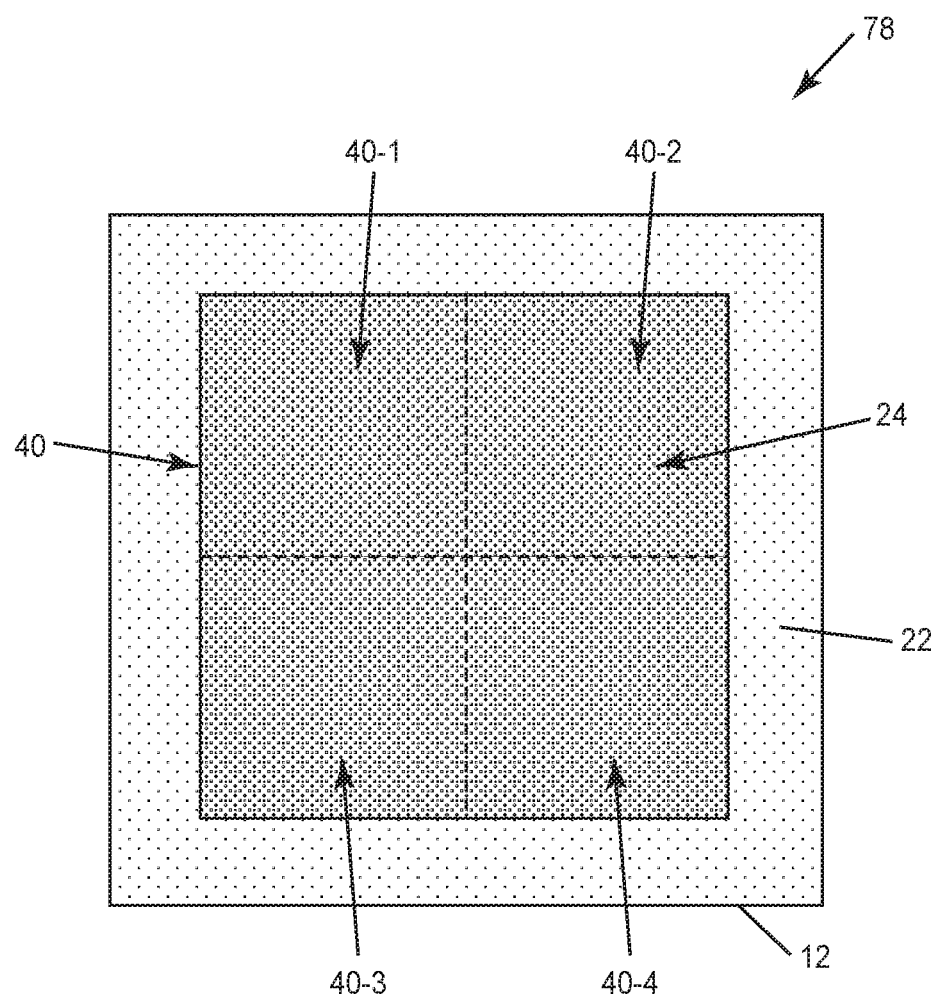
FIG. 9 is a top view of an LED package with an LED chip that includes light emitting junctions arranged in an alternative configuration according to embodiments disclosed herein.

FIG. 8B illustrates a top view of the LED package 72 of FIG. 8A with the addition of the wavelength conversion element 24 and the light-altering material 22. As illustrated, the wavelength conversion element 24 is registered with the LED chip 40 and the light emitting junctions 40-1 to 40-3, and the light-altering material 22 is arranged around peripheral edges of the LED chip 40. In certain embodiments, the light-altering material 22 is arranged to cover a majority of the LED mounting face 12' of the submount 12 that is outside of the LED chip 40. In certain embodiments, the light-altering material 22 is arranged to cover an entire area of the LED mounting face 12' of the submount 12 that is outside of the LED chip 40.

Figure 8C:
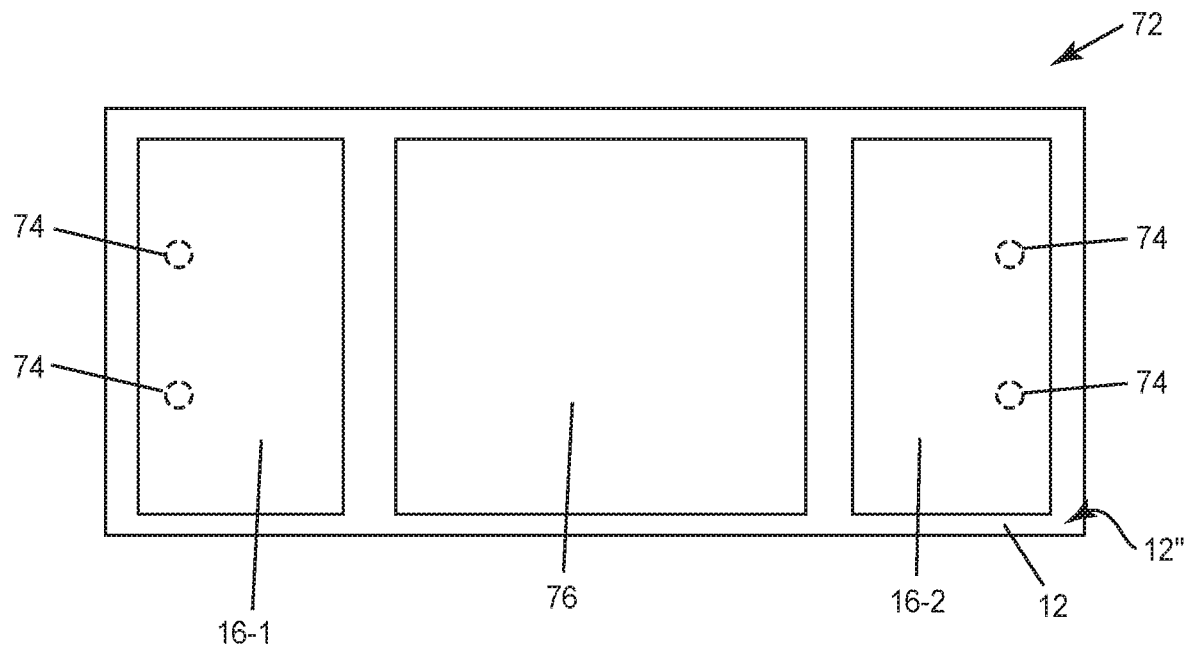
FIG. 8C is a backside or bottom view of the LED package of FIGS. 8A-8B.

FIG. 8C is a backside or bottom view of the LED package 72 of FIGS. 8A-8B. As illustrated, the package contacts 16-1, 16-2 are arranged on the backside of the submount 12. In this manner, the backside of the submount 12 forms a package mounting face 12" that is configured such that the LED package 72 may be mounting to another surface, such as a PCB, and electrical connections for the LED package 72 are provided by mounting the package contacts 16-1, 16-2 to corresponding electrical pads or traces. The one or more conductive vias 74 are arranged through the submount 12 to provide the electrical paths from the package contacts 16-1, 16-2 to the LED chip 40 of FIG. 8A. In certain embodiments, the LED package 72 may further include a thermal pad 76 on the package mounting face 12" of the submount 12. In certain embodiments, the thermal pad 76 includes the same materials as the package contacts 16-1, 16-2. In other embodiments, the thermal pad 76 includes different materials. The thermal pad 76 may be electrically isolated from the package contacts 16-1, 16-2 and may be registered with the LED chip 40 of FIG. 8A to spread heat away from the LED chip 40 of FIG. 8A and through the submount 12 during operation.

Figure 8D:
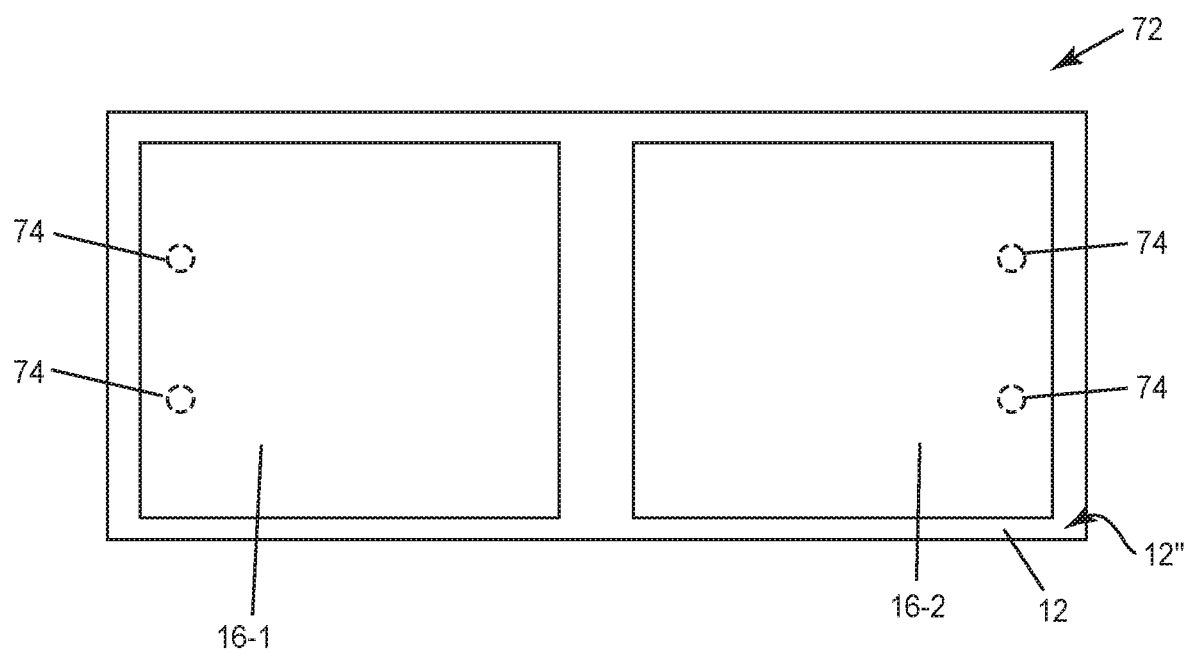
FIG. 8D is a backside or bottom view of the LED package of FIGS. 8A-8B with an alternative configuration according to embodiments disclosed herein.

FIG. 8D illustrates an alternative configuration for the package mounting face 12" of the submount 12. In FIG. 8D, the package contacts 16-1, 16-2 are arranged with larger lateral dimensions and accordingly take up more surface area on the package mounting face 12" of the submount 12. Accordingly, the package contacts 16-1, 16-2 are electrically connected to the LED chip 40 of FIG. 8A and may also spread heat away from the LED chip 40 of FIG. 8A during operation.

FIG. 9 is a top view of an LED package 78 where the LED chip 40 includes multiple light emitting junctions 40-1 to 40-4 arranged in an alternative configuration to previous embodiments. Rather than the linear layout of previous embodiments, the LED chip 40 in FIG. 9 is arranged such that the light emitting junctions 40-1 to 40-4 form a generally square shape on the submount 12. In conventional LED applications, particular for high light output applications, multiple discrete LED chips may be arranged closely together to provide larger emission areas. When four discrete LED chips are arranged in a square, an illumination gap can form the appearance of a dark optical cross or plus sign (similar to the dashed lines shown in FIG. 9). By using the LED chip 40 with the multiple light emitting junctions 40-1 to 40-4, such illumination gaps may be avoided. The LED package 78 may additionally include the wavelength conversion element 24 that forms a common element over each of the light emitting junctions 40-1 to 40-4, and the light-altering material 22 arranged on the submount 12 and around the LED chip 40 as previously described.

Those skilled in the art will recognize improvements and modifications to the preferred embodiments of the present disclosure. All such improvements and modifications are considered within the scope of the concepts disclosed herein and the claims that follow.

What is claimed is:
1. A light-emitting diode (LED) package comprising:
a submount;
an LED chip on the submount, wherein the LED chip comprises an active layer on and supported by a monolithic substrate, wherein the active layer forms a plurality of discrete active layer portions that are arranged between the submount and the monolithic substrate;
a wavelength conversion element on the monolithic substrate; and
a light-altering material on the submount, wherein the light-altering material is arranged around a perimeter of the LED chip and around a perimeter of the wavelength conversion element.
2. The LED package of claim 1, wherein the monolithic substrate is a light transmissive substrate.

3. The LED package of claim 1, wherein the LED chip forms a plurality of recesses that extend through an entire thickness of the active layer to define the plurality of discrete active layer portions.

4. The LED package of claim 3, wherein the LED chip forms a plurality of epitaxial layers on the monolithic substrate and the plurality of recesses extend through an entire thickness of the plurality of epitaxial layers.

5. The LED package of claim 3, wherein the active layer is arranged between a p- type layer and an n-type layer of the LED chip and the plurality of recesses extend through an entire thickness of the p-type layer, the active layer, and the n-type layer.

6. The LED package of claim 3, wherein the light-altering material is arranged at least partially in the plurality of recesses.

7. The LED package of claim 6, wherein the light-altering material and a reflective layer are arranged in each of the plurality of recesses.

8. The LED package of claim 3, wherein a reflective layer is registered in at least one recess of the plurality of recesses.

9. The LED package of claim 8, wherein the reflective layer is arranged between the monolithic substrate and the light-altering material.

10. The LED package of claim 1, wherein each discrete active layer portion of the plurality of discrete active layer portions comprises an anode and a cathode.

11. The LED package of claim 1, wherein the plurality of discrete active layer portions are electrically connected in series.

12. The LED package of claim 1, wherein each discrete active layer portions are electrically connected in series.

13. The LED package of claim 1, wherein the wavelength conversion element comprises a superstrate and a lumiphoric material.

14. The LED package of claim 13, wherein the lumiphoric material is arranged between the superstrate and the monolithic substrate of the LED chip.

15. The LED package of claim 1, wherein the wavelength conversion element comprises phosphor-in-glass.

16. The LED package of claim 1, wherein the wavelength conversion element comprises a ceramic phosphor plate.

17. The LED package of claim 1, wherein the submount further comprises electrical traces that are electrically connected to the LED chip, and one or more package contacts that are electrically connected to the electrical traces, wherein the one or more package contacts are arranged on a same face of the submount as the electrical traces and the one or more package contacts are uncovered by the light-altering material.

18. The LED package of claim 1, wherein the submount further comprises electrical traces that are electrically connected to the LED chip, one or more package contacts that are arranged on an opposite face of the submount than the electrical traces, and one or more electrically conductive vias arranged in the submount and electrically coupled between the electrical traces and the one or more package contacts.

19. The LED package of claim 1, wherein the LED chip is mounted on an LED mounting surface of the submount and the light-altering material is arranged to entirely cover the LED mounting surface outside peripheral edges of the LED chip.

* * * * *

UNITED STATES PATENT AND TRADEMARK OFFICE
CERTIFICATE OF CORRECTION

PATENT NO. : 11,101,411 B2
APPLICATION NO. : 16/453447
DATED : August 24, 2021
INVENTOR(S) : Peter Scott Andrews et al.

It is certified that error appears in the above-identified patent and that said Letters Patent is hereby corrected as shown below:

In the Claims

Claim 4, Column 19, Lines 5-6, replace "wherein the LED chip forms a plurality of epitaxial layers" with --wherein the LED chip comprises a plurality of epitaxial layers.--
Claim 12, Column 19, Lines 32-33, replace "The LED package of claim 1, wherein each discrete active layer portions are electrically connected in series." with --The LED package of claim 1, wherein each discrete active layer portion of the plurality of discrete active layer portions is independently addressable.--

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*